(12) United States Patent
Yoo et al.

(10) Patent No.: US 10,955,301 B2
(45) Date of Patent: Mar. 23, 2021

(54) TWO-DIMENSIONAL CENTER OF PRESSURE SENSOR SYSTEMS, DEVICES, AND METHODS

(71) Applicant: University of Maryland, College Park, College Park, MD (US)

(72) Inventors: Byungseok Yoo, Olney, MD (US); Darryll J. Pines, Clarksville, MD (US)

(73) Assignee: University of Maryland, College Park, College Park, MD (US)

( * ) Notice: Subject to any disclaimer, the term of this patent is extended or adjusted under 35 U.S.C. 154(b) by 135 days.

(21) Appl. No.: 16/162,647

(22) Filed: Oct. 17, 2018

(65) Prior Publication Data

US 2019/0113410 A1 Apr. 18, 2019

Related U.S. Application Data

(60) Provisional application No. 62/573,422, filed on Oct. 17, 2017.

(51) Int. Cl.
| | |
|---|---|
| *G01L 1/18* | (2006.01) |
| *G01L 9/00* | (2006.01) |
| *G01L 9/06* | (2006.01) |
| *H01L 41/047* | (2006.01) |
| *H01L 41/113* | (2006.01) |
| *G01L 1/20* | (2006.01) |

(52) U.S. Cl.
CPC ............. *G01L 1/18* (2013.01); *G01L 9/0042* (2013.01); *G01L 9/0054* (2013.01); *G01L 9/06* (2013.01); *H01L 41/047* (2013.01); *H01L 41/1132* (2013.01); *G01L 1/205* (2013.01)

(58) Field of Classification Search
CPC ............... H01L 41/1132; H01L 41/047; H01L 41/0471; H01L 41/0472; G01L 1/18

USPC .................................. 345/173, 174; 257/419
See application file for complete search history.

(56) References Cited

U.S. PATENT DOCUMENTS

| | | | |
|---|---|---|---|
| 5,237,542 A | 8/1993 | Burke et al. |
| 5,327,397 A | 7/1994 | Burke et al. |
| 5,797,623 A | 8/1998 | Hubbard |
| 5,821,633 A | 10/1998 | Burke et al. |

(Continued)

OTHER PUBLICATIONS

Gong et al., "PrintSense: A versatile sensing technique to support multimodal flexible surface interaction," *Proceedings of the SIGCHI Conference on Human Factors in Computing Systems*, 2014, pp. 1407-1410.

(Continued)

*Primary Examiner* — David Vu
*Assistant Examiner* — Brandon C Fox
(74) *Attorney, Agent, or Firm* — Klarquist Sparkman, LLP

(57) ABSTRACT

A location of a center of pressure is determined in two-dimensions by a multi-layer sensor, which has a first sensing layer with a first sensing area and a second sensing layer with a second sensing area. The first sensing area includes one or more first sensing cells, and the second sensing area includes one or more second sensing cells. The first and second sensing areas overlap in plan view. Each of the first and second sensing cells can be respectively defined by a set of linearly-varying sensing aperture patterns. In each of the first and second sensing cells, a combination of the respective set of linearly-varying sensing aperture patterns forms a uniform sensing aperture pattern. The location of the center of pressure can be determined using a maximum of four output signals from the multi-layer sensor.

23 Claims, 11 Drawing Sheets

(56) References Cited

U.S. PATENT DOCUMENTS

| | | | |
|---|---|---|---|
| 6,223,606 B1 | 5/2001 | Burke et al. | |
| 6,546,813 B2 | 4/2003 | Hubbard, Jr. | |
| 7,415,876 B2 | 8/2008 | Hubbard, Jr. et al. | |
| 9,188,675 B2* | 11/2015 | Bulea | G06F 3/0445 |
| 9,445,751 B2* | 9/2016 | Young | A61B 5/0002 |
| 2007/0247443 A1* | 10/2007 | Philipp | G06F 3/045 |
| | | | 345/173 |
| 2008/0246496 A1* | 10/2008 | Hristov | G06F 3/0446 |
| | | | 324/686 |
| 2011/0273385 A1* | 11/2011 | Liao | G06F 3/045 |
| | | | 345/173 |
| 2012/0256877 A1* | 10/2012 | Lin | G06F 3/044 |
| | | | 345/174 |
| 2015/0247766 A1 | 9/2015 | Yang et al. | |
| 2015/0331524 A1 | 11/2015 | McMillen | |
| 2016/0375910 A1 | 12/2016 | McMillen et al. | |
| 2017/0336891 A1* | 11/2017 | Rosenberg | G06F 3/0412 |
| 2017/0363489 A1* | 12/2017 | Haick | G01L 5/22 |
| 2018/0172845 A1* | 6/2018 | Islam | G01T 1/2935 |

OTHER PUBLICATIONS

Morita et al., "Grasping force control for a robotic hand by slip detection using developed micro laser doppler velocimeter," *Sensors*, 2018, 18, 326.

Sensitronics, LLC, "FSR 101—Force sensing resistor theory and applications," White Paper, Rev. 1.01 [online], 2016 [retrieved on Oct. 16, 2018]. Retrieved from the Internet: <URL: http://web.archive.org/web/20160810235837/http://sensitronics.com/pdf/Sensitronics_FSR_101.pdf>.

Stassi et al., "Flexible tactile sensing based on piezoresistive composites: A review," *Sensors*, 2014, 14: pp. 5296-5332.

Xu et al., "One-dimensional contact mode interdigitated center of pressure sensor (CMIPS)," Pre-print [online] of *Applied Physics Letters*, 2009, 94(23): 233503 [retrieved Oct. 16, 2018]. Retrieved from the Internet:<URL: https://ntrs.nasa.gov/search.jsp?R=20090027901>.

Keats-Pullen et al., "Spatial weighting of smart materials for real-time measurement of aerodynamic forces," *Journal of Intelligent Material Systems and Structures*, Jul. 2008, 19(7): pp. 837-844.

Hubbard, J. E. Chapter 2, "Spatial Shading of Distributed Transducers" in: *Spatial Filtering for the Control of Smart Structures: An Introduction* (Heidelberg, Springer, 2010), pp. 25-67.

Park et al., "Design and fabrication of soft artificial skin using embedded microchannels and liquid conductors," *IEEE Sensors Journal*, Aug. 2012, 12(8): pp. 2711-2718.

Resistive Technology. Website [online]. Interlink Electronics, Inc., 2016 [retrieved on Sep. 26, 2019]. Retrieved from the Internet: <URL: http://web.archive.org/web/20161006155414/http://www.interlinkelectronics.com/resistive.php>.

\* cited by examiner

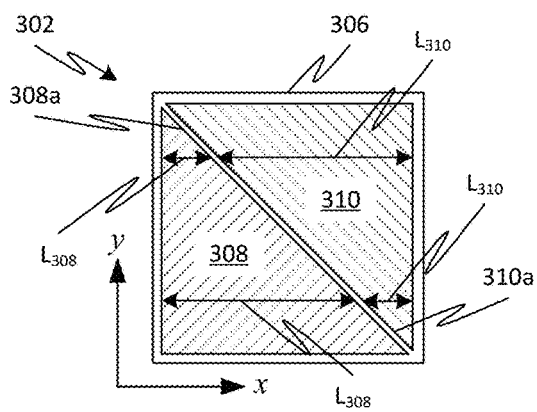
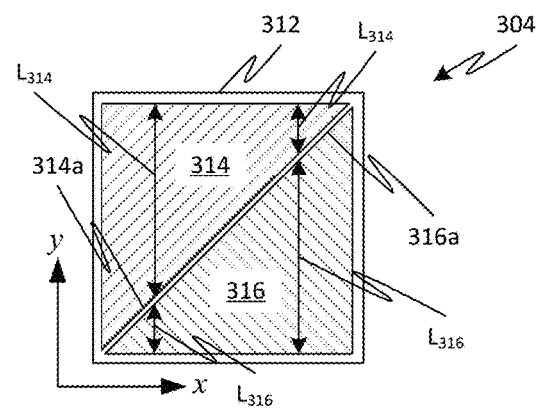
FIG. 3A  FIG. 3B
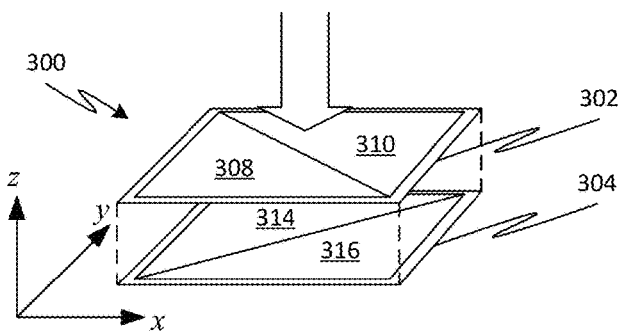
FIG. 3C
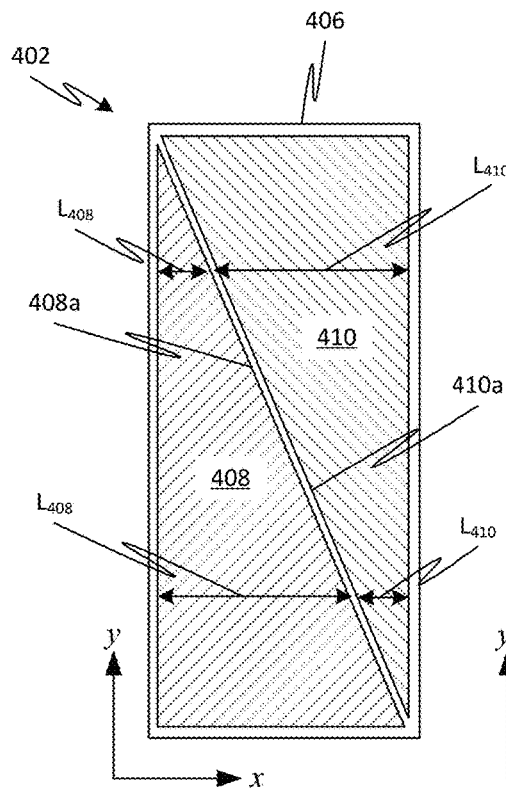
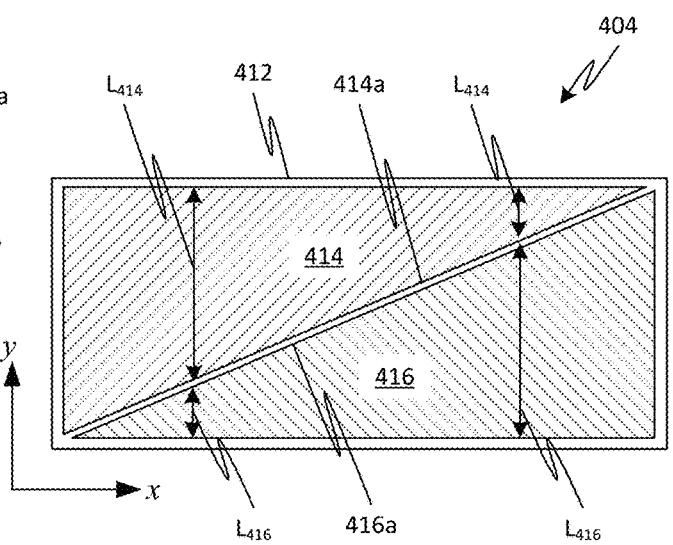
FIG. 4A  FIG. 4B

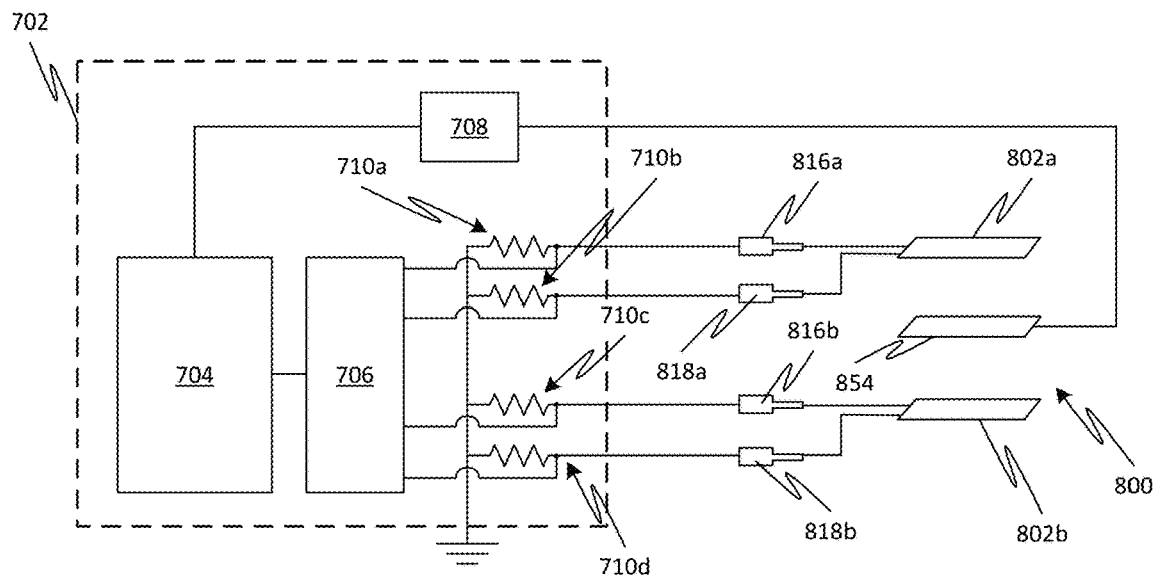
FIG. 8A
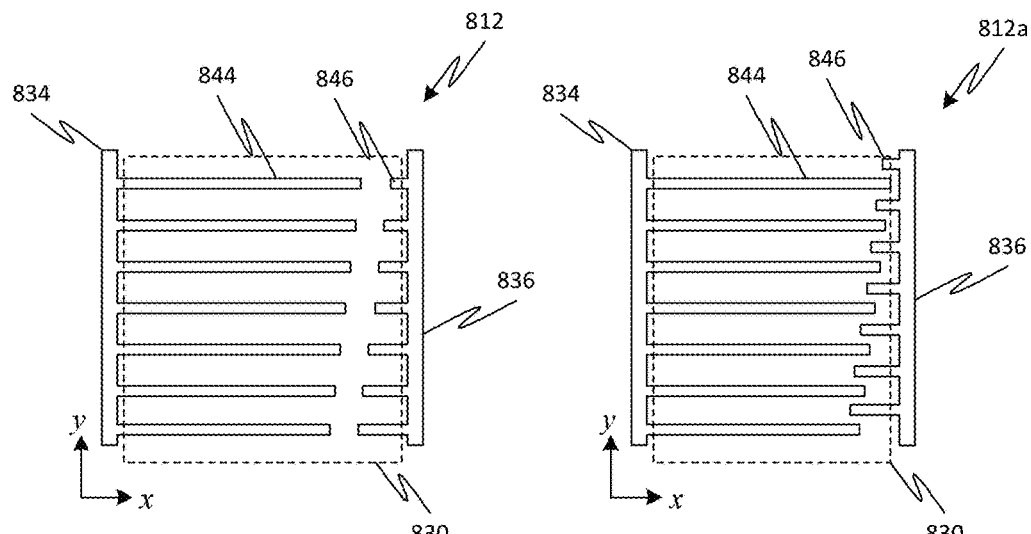
FIG. 8B
FIG. 8C
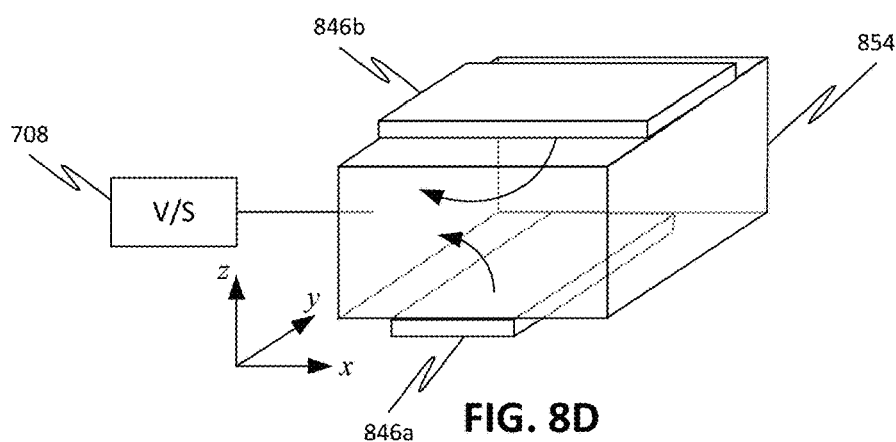
FIG. 8D

TWO-DIMENSIONAL CENTER OF PRESSURE SENSOR SYSTEMS, DEVICES, AND METHODS

CROSS-REFERENCE TO RELATED APPLICATIONS

The present application claims the benefit of U.S. Provisional Application No. 62/573,422, filed Oct. 17, 2017, which is hereby incorporated by reference herein in its entirety.

FIELD

The present disclosure relates generally to pressure sensing, and more particularly, to systems, devices, and methods for sensing a center of applied pressure in two-dimensions.

SUMMARY

Embodiments of the disclosed subject matter measure a location in two-dimensions of a center of pressure (CoP) by using a multi-layer sensor. The multi-layer sensor is a laminated structure of separate sensing layers, each sensing layer including one or more sensing areas patterned by a set of varying sensing apertures, for example, a linearly-varying sensing aperture. Signals output from the sensing areas can be used to simply determine a location of the CoP on the multi-layer sensor. For example, the multi-layer sensor may be constructed such that the CoP can be determined in real-time (or substantially in real-time) using no more than four output signals (e.g., a pair of output signals per sensing layer). The sensing areas of the sensor may be constructed of a piezo-resistive material, a piezo-electric material, or a piezo-conductive material. For example, the sensor can employ a force sensitive resistance (FSR) technique using patterned interdigitated electrodes.

In one or more embodiments, a sensor system comprises a sensor having first and second layers. The first layer has a first sensing area patterned by a set of first sensing apertures. Each first sensing aperture has a respective linear variation along a first direction. A combination of the set of first sensing apertures forms a uniform sensing aperture. The second layer has a second sensing area overlaying the first sensing area. The second sensing area is also patterned by a set of second sensing apertures. Each second sensing aperture has a respective linear variation along a second direction orthogonal to the first direction. A combination of the set of second sensing apertures forms another uniform sensing aperture.

In one or more embodiments, a method of determining a location of a center in two-dimensions of applied pressure comprises providing a multi-layer sensor having a first sensing layer with a first sensing area and a second sensing layer with a second sensing area. The first sensing area includes a plurality of first sensing cells disposed along a second direction. The second sensing area including a plurality of second sensing cells disposed along a first direction orthogonal to the second direction. The first and second sensing areas overlap in plan view. The method further comprises receiving no more than four output signals from the first and second sensing layers. The method also comprises determining the location of the center of pressure along the first direction based on a ratio of one of the output signals received from the first sensing layer to a sum of the output signals received from the first sensing layer, and determining the location of the center of pressure along the second direction based on a ratio of one of the output signals received from the second sensing layer to a sum of the output signals received from the second sensing layer.

Objects and advantages of embodiments of the disclosed subject matter will become apparent from the following description when considered in conjunction with the accompanying drawings.

BRIEF DESCRIPTION OF DRAWINGS

Embodiments will hereinafter be described with reference to the accompanying drawings, which have not necessarily been drawn to scale. Where applicable, some elements may be simplified or otherwise not illustrated in order to assist in the illustration and description of underlying features. Throughout the figures, like reference numerals denote like elements.

FIG. 3A is a simplified plan view of a sensing aperture pattern for a first sensing layer of a CoP sensor, according to one or more embodiments of the disclosed subject matter.

FIG. 3B is a simplified plan view of a sensing aperture pattern for a second sensing layer of the CoP sensor, according to one or more embodiments of the disclosed subject matter.

FIG. 3C is a simplified, exploded perspective view of the CoP sensor employing the sensing layers of FIGS. 3A-3B.

FIG. 4A is a simplified plan view of a patterned unit sensing area for a first sensing layer of a CoP sensor, according to one or more embodiments of the disclosed subject matter.

FIG. 4B is a simplified plan view of a patterned unit sensing area for a second sensing layer of the CoP sensor, according to one or more embodiments of the disclosed subject matter.

FIG. 8A is a simplified schematic diagram illustrating a second configuration of a sensing system and CoP sensor, according to one or more embodiments of the disclosed subject matter.

FIG. 8B is a close-up plan view of a unit cell region in a sensing layer of an exemplary CoP sensor employed in the configuration of FIG. 8A.

FIG. 8C is a close-up plan view of a variation of a unit cell region in a sensing layer of an exemplary CoP sensor employed in the configuration of FIG. 8A.

FIG. 8D is a simplified illustration of the pressure sensing mechanism underlying the configuration of FIG. 8A.

DETAILED DESCRIPTION

Embodiments of the disclosed subject matter allow for the determination of a location in two-dimensions of a center of pressure (CoP) applied to a multi-layer sensor. In some embodiments, the multi-layer sensor may also provide a measure of a magnitude of the applied pressure. The multi-layer sensor has specifically patterned sensing areas on separate laminated sensing layers, which allow the CoP to be determined using a minimum number of output signals from the sensor. In particular, each sensing area is patterned using at least one linearly varying sensing aperture, which allows for simple determination of a location of the CoP with respect to the sensing areas in real-time (or in substantially real-time). In some embodiments, the CoP can be determined using a maximum of four output signals. In other embodiments, the maximum number of output signals may correspond to a number of the separately patterned regions per unit sensing area times the number of sensing layers.

Figure 1:
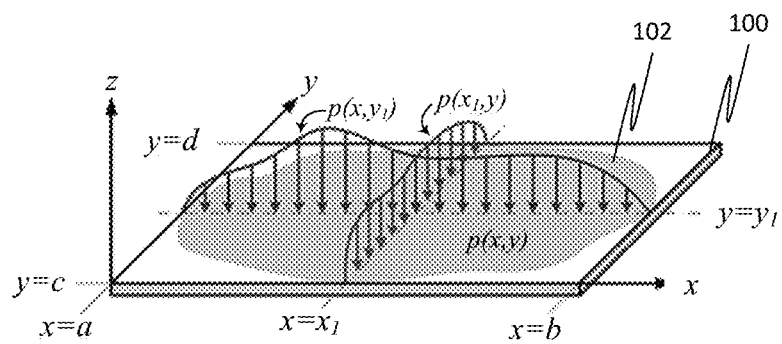
FIG. 1 is a graph of a coordinate system for defining a center-of-pressure (CoP), according to one or more embodiments of the disclosed subject matter.

The CoP denotes the centroid position of pressure applied to a surface. For example, FIG. 1 illustrates an applied static pressure distribution $p(x,y)$ 102 applied to a sensing area 100. The CoP along specific lines, i.e., $y=y_1$ or $x=x_1$, can be given by:

$$C_{p,x} = \frac{\int_a^b x \cdot p(x, y_1) dx}{\int_a^b p(x, y_1) dx} \quad (1)$$

$$C_{p,y} = \frac{\int_c^d y \cdot p(x_1, y) dy}{\int_c^d p(x_1, y) dy} \quad (2)$$

where [a, b] and [c,d] define the apertures of the measurement at constant locations of $y=y_1$ or $x=x_1$, respectively; x and y are the spatial coordinates; and $p(x,y)$ is a spatially distributed pressure acting on the surface of the sensing area 100.

The CoP along the specified constant line of Eqn. (1) indicates a ratio that defines a spatially shaded pressure distribution along x normalized by the integrated pressure load over the sensing aperture, and its value ($C_{p,x}$) becomes 0 when x=0 or 1 when x=1. Similarly, the CoP along a specified constant line shown in Eqn. (2) indicates a ratio that defines a spatially shaded pressure distribution along y normalized by the integrated pressure load over the sensing aperture, and its value (Cp,y) becomes 0 when y–0 or 1 when y–1.

The pressure distribution 102 may vary along the sensing apertures 100 and with respect to time. Within the finite sensing apertures [a, b] and [c,d], the real-time centroid of the distributed dynamic pressure 102, p(x,y,t), along the x- or y-directions is given by:

$$C_{p,x}(t) = \frac{\int_c^d \int_a^b x \cdot p(x, y, t) dx dy}{\int_c^d \int_a^b p(x, y, t) dx dy} \quad (3)$$

$$C_{p,y}(t) = \frac{\int_c^d \int_a^b y \cdot p(x, y, t) dx dy}{\int_c^d \int_a^b p(x, y, t) dx dy} \quad (4)$$

Eqns. (3) and (4) provide the total pressure at time t and the ratio relative to the pressure center location along a continuously distributed sensor. Based on the expressions in Eqns. (3) and (4), it can be derived that the CoP along a surface can be determined by measuring two component integrals over the sensing apertures [a,b] and [c,d], and then taking their ratio. In particular, in Eqns. (3) and (4), the numerator represents a linearly varying sensing aperture (i.e., continuously varying along a direction), and the denominator represents a uniform sensing aperture (i.e., constant along the same direction). Thus, by providing a linearly varying sensing aperture coincident (or at least overlapping) with a uniform sensing aperture, the CoP of the applied pressure can be directly derived from the resulting measurement signals.

Figure 2A:
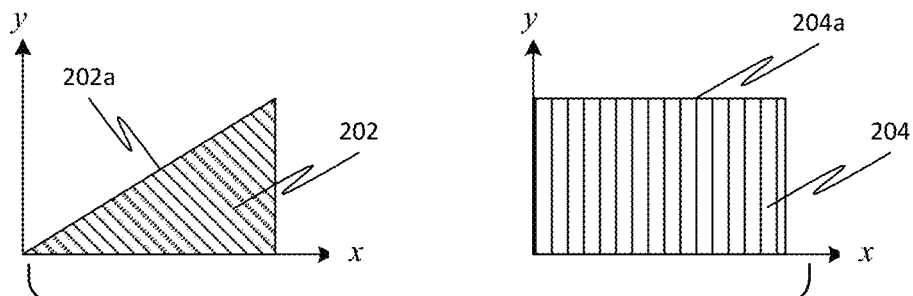
FIG. 2A illustrates the composition of sensing apertures for use in determining CoP, according to one or more embodiments of the disclosed subject matter.

FIG. 2A shows an example of a combination 200 of a linearly varying sensing aperture 202 overlapping with a uniform sensor aperture 204. Each aperture can be defined by a respective weighting function, w(x). The linearly varying sensing aperture 202 is defined by a line 202a, where w(x)=mx+b and m, b are constants. In contrast, the uniform sensing aperture 204 is defined by a horizontal line 204a, where w(x)=c and c is a constant. The CoP along a specified line, e.g., y=constant, can be determined by simple processing of the measurement data (e.g., strain, resistance, or capacitance) induced by the distributed pressure applied to the sensing area, which is patterned by the combined shaded sensing aperture 200.

Figure 2B:
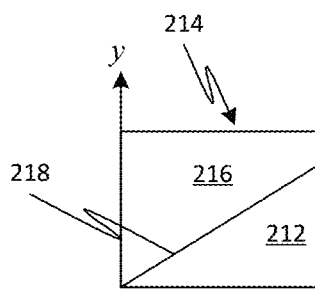
FIG. 2B is a graphical illustration of a first example sensing aperture composition for use in determining CoP, according to one or more embodiments of the disclosed subject matter.

In embodiments of the disclosed subject matter, the patterning of the sensing area based on combined sensing aperture 210 can result in a complementary pair of linearly varying sensing apertures in plan view, as illustrated in FIG. 2B. A line 218 can define a first linearly varying sensing aperture 212 and a second linearly varying sensing aperture 216, which is substantially identical in shape to the first sensing aperture 212 but rotated 180°. Together, the two sensing apertures 212, 216 combine to form a uniform sensing aperture 214. To determine CoP, a ratio of a signal from one of the linearly varying sensing apertures 212, 216 to a sum of the signals from both of the linearly varying sensing apertures 212, 216 (i.e., effectively, the uniform sensing aperture 214) is used to provide a relative indication of the CoP location with respect to the x-direction.

Figure 2C:
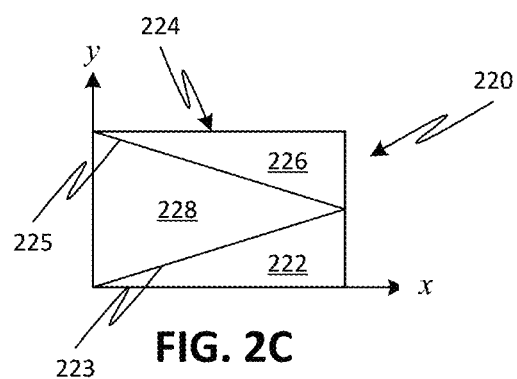
FIG. 2C is a graphical illustration of a second example sensing aperture composition for use in determining CoP, according to one or more embodiments of the disclosed subject matter.

Although FIG. 2B illustrates a particular number of linearly varying sensing apertures, embodiments of the disclosed subject matter are not limited thereto. Indeed, more than two linearly varying sensing apertures are also possible according to one or more contemplated embodiments, so long as the combination of the linearly varying sensing apertures yields a uniform sensing aperture. For example, FIG. 2C shows a composite sensing aperture 220 that is formed by the combination of three linearly varying sensing apertures 222, 226, and 228. A first linearly varying sensing aperture 222 is defined by a first line 223, while a second linearly varying sensing aperture 226 is defined by a second line 225. A third linearly varying sensing aperture 228 is defined by the first 223 and second 225 lines. The first through third sensing apertures 222, 226, 228 are complementary, such that their combination yields a uniform sensing aperture 224. In FIG. 2C, lines 223 and 225 have opposite slopes of the same magnitude, such that first sensing aperture 222 is a mirror image of second sensing aperture 226; however, embodiments are not limited to this particular arrangement. Rather, the first through third sensing apertures 222, 226, 228 can have shapes other than those illustrated, so as long as the combination yields uniform sensing aperture 224.

Figure 2D:
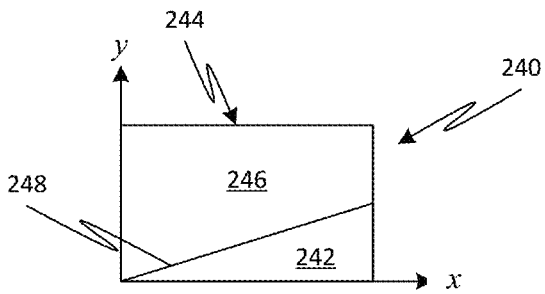
FIG. 2D is a graphical illustration of a third example sensing aperture composition for use in determining CoP, according to one or more embodiments of the disclosed subject matter.

Although FIG. 2B illustrates that line 218, which defines the linear variation, begins at the origin and ends at the vertex of uniform sensing aperture 214 (i.e., such that the sensing area at one end of the aperture goes to zero), embodiments of the disclosed subject matter are not limited thereto. Indeed, in practical embodiments, the linear variation may be defined to include at least some sensing area at each end of the sensing aperture. For example, FIG. 2D shows a composite sensing aperture 230 that is formed by the combination of linearly varying sensing apertures 232, 236. Line 238, which is spaced from ends in the y-direction of the sensing area, defines the first linearly varying sensing aperture 232 and the second linearly varying sensing aperture 236. As with the configuration in FIG. 2B, the sensing apertures 232, 236 are substantially complementary, such that their combination yields a uniform sensing aperture 234.

Figure 2E:
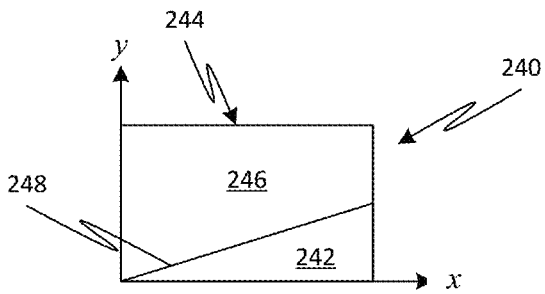
FIG. 2E is a graphical illustration of a fourth example sensing aperture composition for use in determining CoP, according to one or more embodiments of the disclosed subject matter.

Similar to FIG. 2B, the first sensing aperture 232 in FIG. 2D may be substantially identical in shape to the second sensing aperture 236 rotated 180°. However, embodiments of the disclosed subject matter do not require that the first and second sensing apertures be substantially identical rotations of each other. For example, FIG. 2E illustrates an alternative configuration, where a composite sensing aperture 240 is formed by the combination of differently shaped linearly varying sensing apertures. Line 248 may jointly define first linearly varying sensing aperture 242 and second linearly varying sensing aperture 246. As with the previously described figures, the combination of the first and second sensing apertures 242 and 246 are substantially complementary so as to form a uniform sensing aperture 244. However, the location of line 248 divides the uniform sensing aperture 244 into unequal areas. As such, a sensing area patterned by the first sensing aperture 242 may be less than that of the second sensing aperture 246, or vice versa.

It is noted that the discussion of FIGS. 2A-2E above is with respect to one of the sensing layers of a sensor, as the combination of the linearly varying sensing aperture and the uniform sensing aperture only provide information regarding the CoP location in one dimension. To provide information regarding the CoP in a second dimension, a second sensing layer is used, where the sensing area of the first sensing layer coincides with the sensing area of the second sensing layer in plan view. The second sensing layer also includes a combination of a linearly varying sensing aperture with a uniform sensing aperture, but the orientation is rotated 90° about the z-direction.

For example, FIGS. 3A-3C illustrate an exemplary configuration of sensing layers of a multi-layer CoP sensor 300. FIG. 3A illustrates a first sensing layer 302, which has a first orientation in plan view. In particular, the first sensing layer 302 is patterned by a first linearly varying sensing aperture 308, where a line 308a defines a length $L_{308}$ along the x-direction (first direction) of the sensing area 306 that decreases in the y-direction (second direction). The first sensing layer 302 is also patterned by a second linearly varying sensing aperture 310, which is complementary to the first linearly varying sensing aperture 308, such that their combination yields a uniform sensing aperture. For the second linearly varying sensing aperture 310, a line 310a defines a length $L_{310}$ along the x-direction of the sensing area that increases along the y-direction.

FIG. 3B illustrates a second sensing layer 304, which has a second orientation in plan view. In particular, the second sensing layer 304 is patterned by a third linearly varying sensing aperture 314, where a line 314a defines a length $L_{314}$ along the y-direction of the sensing area 312 that decreases in the x-direction. The second sensing layer 304 is also patterned by a fourth linearly varying sensing aperture 316, which is complementary to the third linearly varying sensing aperture 314, such that their combination yields a uniform sensing aperture. For the fourth linearly varying sensing aperture 316, a line 316a defines a length $L_{316}$ along the y-direction of the sensing area 312 that decreases along the x-direction.

For example, the configuration of the first sensing layer 302 may be substantially identical to that of the second sensing layer 304 but rotated 90°, such that the first orientation is orthogonal to that of the second orientation. As noted above, the sensing areas should also substantially coincide. The total sensing area 306, 312 of each sensing layer 302, 304 may thus have a substantially square shape in plan view. When combined together in sensor 300, the first sensing layer 302 can provide an indication of the location of the CoP along the y-direction, while the second sensing layer 304 can provide an indication of the location of the CoP along the x-direction.

In embodiments, the pressure/force sensing technology employed by the sensing areas 306, 312 of sensor 300 can include any type of piezo-electric, piezo-resistive, or piezo-conductive material known in the art. For example, the sensing areas can employ a force sensitive resistance (FSR) technique, where the applied pressure displaces interdigitated electrodes into contact with a conductive film, as described in further detail below.

While the use of a single set of combined sensing apertures to pattern each sensing layer 302, 304 has been illustrated in FIGS. 3A-3C, practical implementations based on such a configuration may be limited due to the requirement that the sensing area of the top sensing layer be coincident with that of the bottom sensing layer. Accordingly, in some embodiments of the disclosed subject matter, each sensing layer may be patterned by a set (i.e., two or more) of combined sensing apertures. In such a configuration, a unit sensing area, patterned by a respective combination of linearly sensing apertures, may be arrayed across the total sensing area of each sensing layer. A length of the unit sensing area in the top sensing layer may correspond to a width of the array of the unit sensing areas in the bottom sensing layer, such that the total sensing areas of the top and bottom sensing layers are coincident (e.g., such that the sensing areas of the top and bottom sensing layers are substantially square and equal).

For example, FIG. 4A illustrates an example of a unit sensing area 402 of a first sensing layer, while FIG. 4B illustrates an example of a unit sensing area 404 of a second sensing layer. As with FIGS. 3A-3B, the unit sensing areas 402, 404 of FIGS. 4A-4B have a pair of linearly varying sensing apertures that define varying lengths of the respective sensing areas and that are complementary so as to form a uniform sensing aperture in combination. Thus, FIG. 4A illustrates a first linearly varying sensing aperture 408, where line 408a defines length $L_{408}$ that has a variation along the y-direction, and a second linearly varying sensing aperture 410, where line 410a defines length $L_{410}$ that has an opposite variation along the y-direction. FIG. 4B illustrates a third linearly varying sensing aperture 414, where line 414a defines length $L_{414}$ that has a variation along the x-direction, and a fourth linearly varying sensing aperture 416, wherein line 416a defines length $L_{416}$ that has an opposite variation along the x-direction.

Figure 5A:
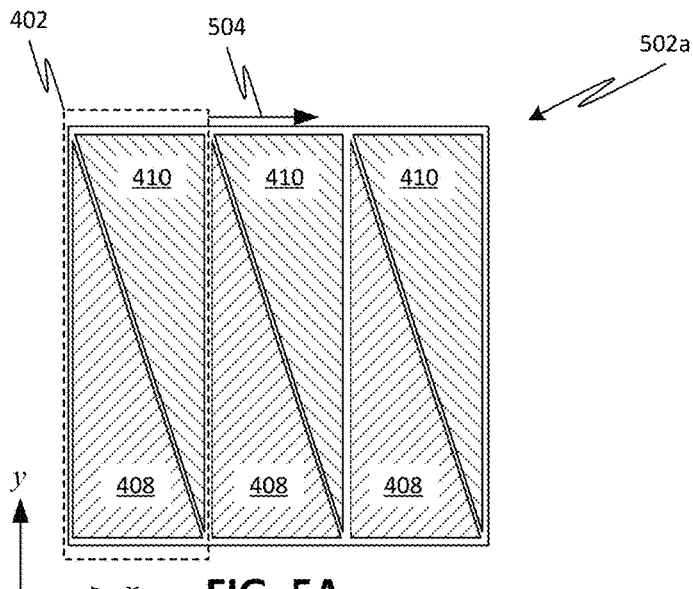
FIG. 5A is a simplified plan view of an arrangement for an array of the patterned sensing areas of FIG. 4A, according to one or more embodiments of the disclosed subject matter.

The unit sensing area can be arrayed adjacent across the entire sensing area of the particular sensing layer, such that multiple sets of the linearly varying sensor apertures are used to pattern the sensing area. In particular, the unit sensing area can be arrayed along a direction orthogonal to that in which the linear variation is provided. For example, since the linear variation in the unit sensing area 402 of FIG. 4A is along the y-direction, the unit sensing area 402 can be arrayed adjacent along the x-direction 504, as illustrated in FIG. 5A. Thus, in FIG. 5A, a first sensing layer 502a can be patterned by sets of linearly varying sensing apertures 408, 410 of similarly arranged unit sensing areas 402 and forming a substantially square total sensing area. A second sensing layer laminated with the first sensing layer can have an arrangement similar to that of the first sensing layer 502a, but rotated 90° about the z-direction.

Figure 5B:
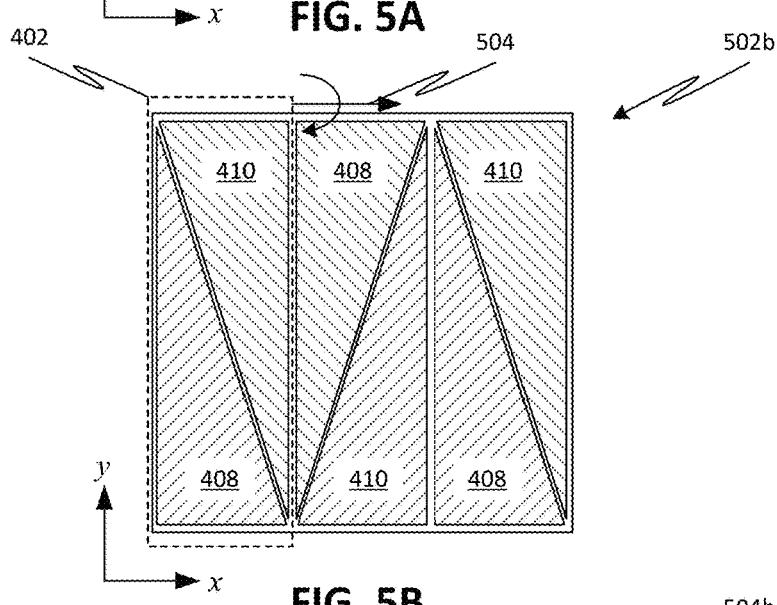
FIG. 5B is a simplified plan view of an arrangement for an array of the patterned sensing areas of FIG. 4A for a first sensing layer of the CoP sensor, according to one or more embodiments of the disclosed subject matter.
Figure 5C:
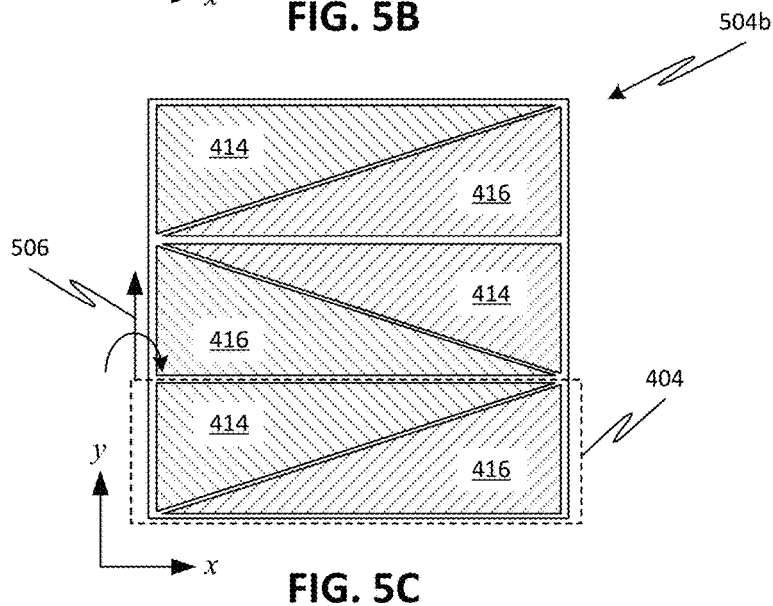
FIG. 5C is a simplified plan view of an arrangement for an array of the patterned sensing areas of FIG. 4B for a second sensing layer of the CoP sensor, according to one or more embodiments of the disclosed subject matter.

Alternatively, the unit sensing area can be arrayed along a direction orthogonal to that in which the linear variation is provided, but with an alternating orientation, for example, as illustrated in FIGS. 5B-5C. For example, the unit sensing area 402 of FIG. 4A can be arrayed along the x-direction 504 in the first sensing layer 502b, but adjacent pairs of unit sensing areas 402 can be rotated 180° about the z-direction with respect to each other, as illustrated in FIG. 5B. Similarly, the unit sensing area 404 can be arrayed along y-direction 506 in the second sensing layer 504b, with adjacent pairs of unit sensing areas 404 rotated 180° about the z-direction with respect to each other.

Figure 5D:
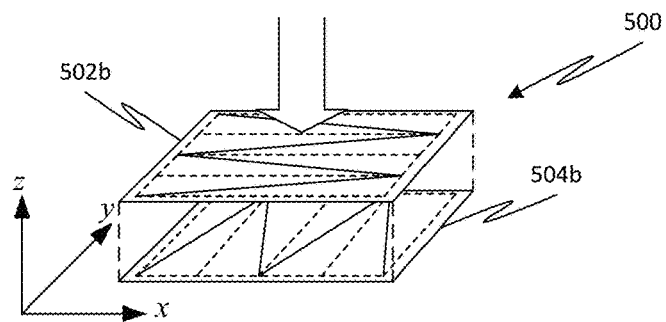
FIG. 5D is a simplified, exploded perspective view of the CoP sensor employing the sensor layers of FIG. 5B-5C.

The resulting patterns of the first sensing layer 502b and the second sensing layer 504b can have a similar configuration but rotated 90° with respect to each other. As shown in FIG. 5D, the first 502b and second 504b sensing layers can be laminated together as part of multi-layer sensor 500, where the total sensing area of the first sensing layer 502b is substantially equal to and coincident with the total sensing area of the second sensing layer 504b in plan view. As noted above, the first sensing layer 502b provides an indication of the CoP location in one dimension while the second sensing layer 504b provides a simultaneous indication of the CoP location in the orthogonal dimension.

Figure 6A:
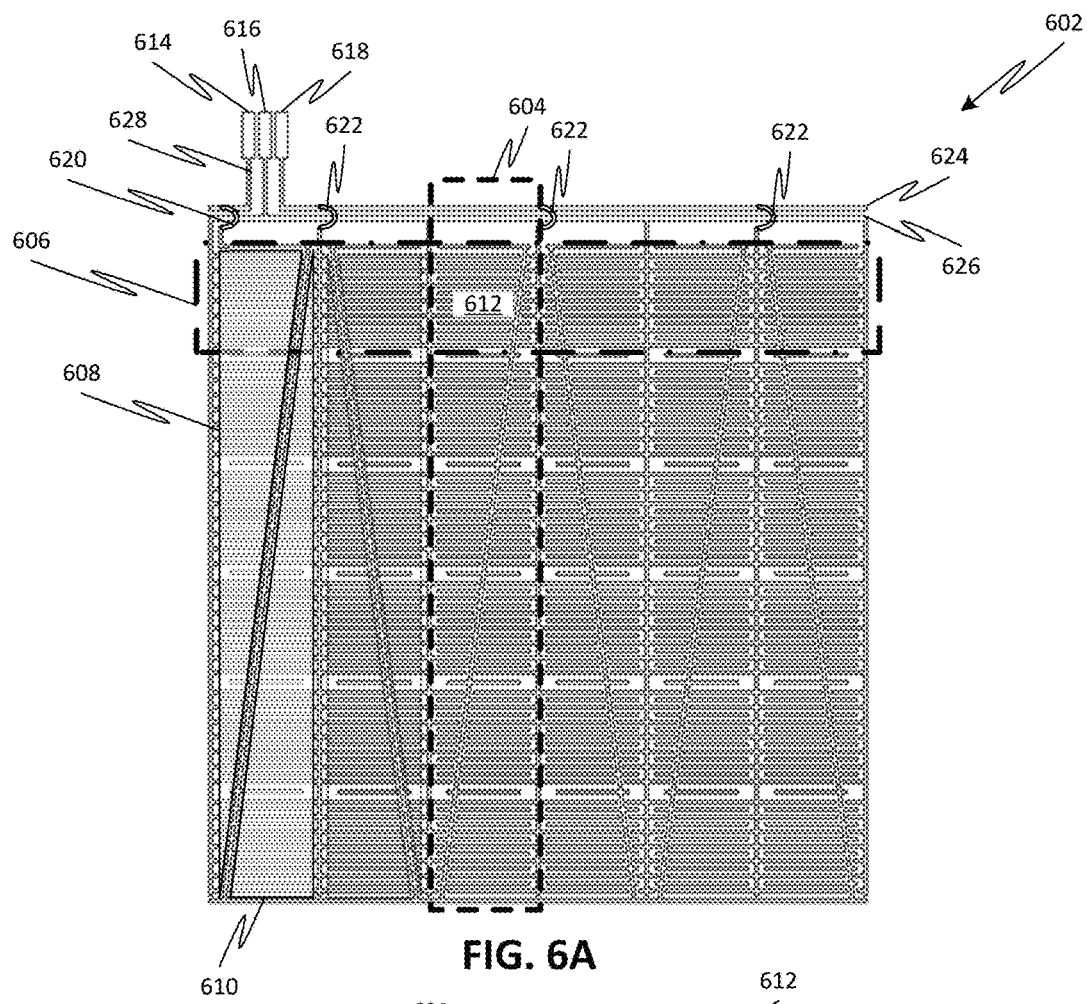
FIG. 6A is a plan view of an exemplary configuration of a sensing layer of a CoP sensor employing a force sensitive resistance technique, according to one or more embodiments of the disclosed subject matter.

As noted above, the pressure/force sensing technology employed by the sensing areas of the multi-layer sensor can include any type of piezo-electric, piezo-resistive, or piezo-conductive material known in the art. For example, FIGS. 6A-6G illustrate an exemplary configuration of a multi-layer sensor 600 employing an FSR technique. FIG. 6A shows the patterned layout of a sensing area for a generalized sensing layer 602, where a unit sensing area 604 (only one of which is identified in the figure) has been arrayed adjacent along a first direction. In another sensing layer overlaid with or underlying sensing layer 602, a unit sensing area 606 (only one of which is identified in the figure) would be similar to unit sensing area 604 but rotated 180°, such that the intersection of unit sensing areas 604 and 606 in plan view defines a unit cell region 612 (only one of which is identified in the figure).

Each unit sensing area 604 can have interdigitated electrodes patterned by a set of linearly varying sensing apertures 608, 610 (only one of each is identified in the figure). Although six sets of sensing apertures 608, 610 are illustrated in the figures, embodiments of the disclosed subject matter are not limited thereto, and fewer or more sets of sensing apertures (and thus unit sensing areas of the array) are possible according to one or more contemplated embodiments. The linearly varying sensor apertures 608, 610 pattern a respective interdigitated electrode pattern within each unit sensing area 604. The discrete unit cells 612 have specific aperture shading signatures defined by the interdigitated electrode pattern therein that allow the identification of the location of pressure applied thereto along the axial direction (i.e., the direction of the linear variation).

Figure 6B:
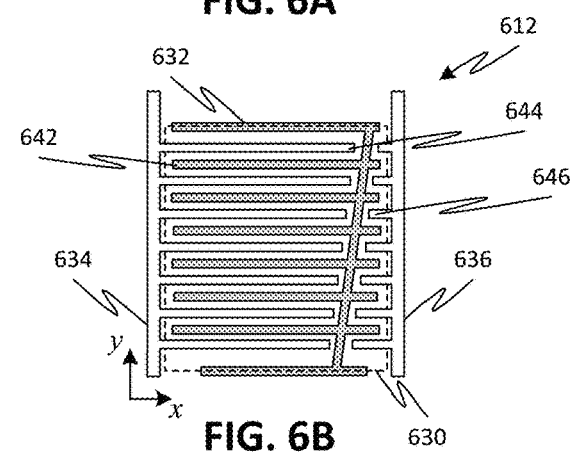
FIG. 6B is a close-up plan view of a unit cell region in the sensing layer of FIG. 6A.

Referring to FIG. 6B, the interdigitated electrode pattern within the sensing area 630 of the unit cell 612 includes a first set of electrodes 644 having lengths patterned by the first linearly varying aperture 608 and a separate second set of electrodes 646 having lengths patterned by the second linearly varying aperture 610. Electrodes 644 are electrically connected together by a common conductive trace 634, and electrodes 646 are electrically connected together by another common conductive trace 636. Another set of electrodes 632 (i.e., power electrodes) is provided between the electrodes 644 and electrodes 646. For example, a width of each electrode 632, 642, 644 (i.e., in FIG. 6B, a dimension along the y-direction) can be less than 1 mm (e.g., 0.01 in. or ~250 µm). A gap between adjacent electrodes (i.e., in FIG. 6B, a space between electrodes adjacent along the y-direction) can be the same as or within an order of magnitude of the electrode width.

Returning to FIG. 6A, each of the unit sensing areas 604, in particular the electrodes 644 patterned by sensor aperture 608, the electrodes 646 patterned by sensor aperture 610, and the power electrodes 632, are connected together in parallel. For example, a wiring bus can include a first connective trace 628 that connects a power terminal 614 (E1) to the power electrodes 632 via a jumper connection 620. Further connections to the power electrodes 632 of adjacent unit sensing areas 604 can be made via a common trace at a bottom of each unit sensing area 604. The wiring bus can also include a second connective trace 626 that connects a first sensing terminal 616 (E2) to the electrodes 644 patterned by sensor apertures 608 via conductive traces 634. The wiring bus can also include a third connective trace 624 that connects a second sensing terminal 618 (E3) to the electrodes 646 patterned by sensor apertures 610 via jumper connections 622 and conductive traces 636. Of course, one of ordinary skill in the art will appreciate that other wiring configurations beyond those specifically illustrated in FIG. 6A are also possible. Accordingly, embodiments of the disclosed subject matter are not limited to the specific wiring configurations illustrated.

A power signal (e.g., DC voltage) can be applied to the electrodes 632, and a resulting output can be measured from the electrodes 644 and 646. In the absence of applied pressure, the electrodes 632, 644, and 646 are electrically isolated from each other such that current does not flow between electrodes 632 and electrodes 644, 646. However, when sufficient pressure is applied, the electrodes are displaced (perpendicular to the plane of the page) into contact with a conductive layer, such that current can flow between electrodes 632 and electrodes 644, 646. The resulting output signals are based on the effective resistance between the power terminal and the respective sense terminals and are a function of the interdigitated electrode 644, 646 lengths in the respective linearly variable sensing apertures. The sensor measurement for the uniformly shaded aperture can be determined by adding up the measured outputs from the two linearly shaded apertures 608, 610, which are based on the interdigitated electrode lines 644, 646 within the respective aperture regions.

Figure 6C:
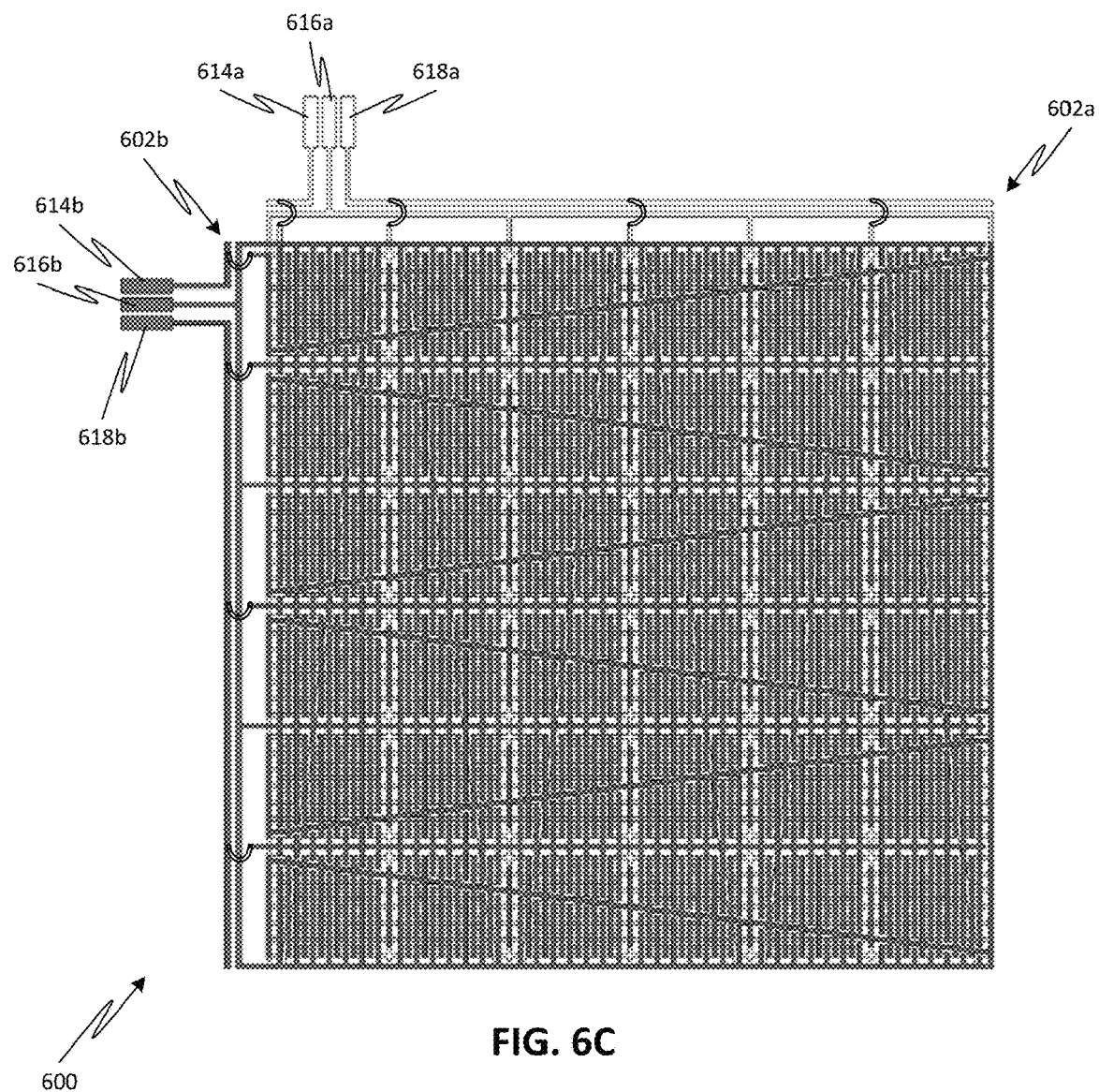
FIG. 6C is a plan view of an exemplary configuration of laminated sensing layers forming the CoP sensor, according to one or more embodiments of the disclosed subject matter.
Figure 6D:
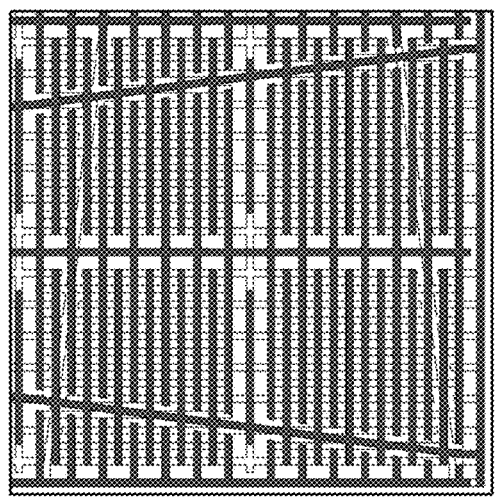
FIG. 6D is a close-up plan view of laminated sensing layers forming the CoP sensor of FIG. 6C.

FIGS. 6C-6D illustrate the multi-layer sensor 600 formed by providing a first sensing layer 602a with the configuration illustrated in FIG. 6A and a second sensing layer 602b overlying the first sensing layer 602a and having the configuration illustrated in FIG. 6A rotated 90° with respect to the first sensing layer 602a. Each of the sensing layers 602a, 602b has respective terminals 614a-618a and 614b-618b; however, as discussed in further detail below, it is possible to provide power input via only one of the power terminals 614a, 614b (or via the conductive layer intervening between the first and second sensing layers, as discussed with respect to the variation of FIGS. 8A-8C), such that the CoP measurement can be obtained via no more than five connections—a single power connection and four signal output connections to terminals 616a-618a, 616b-618b.

Figure 6E:
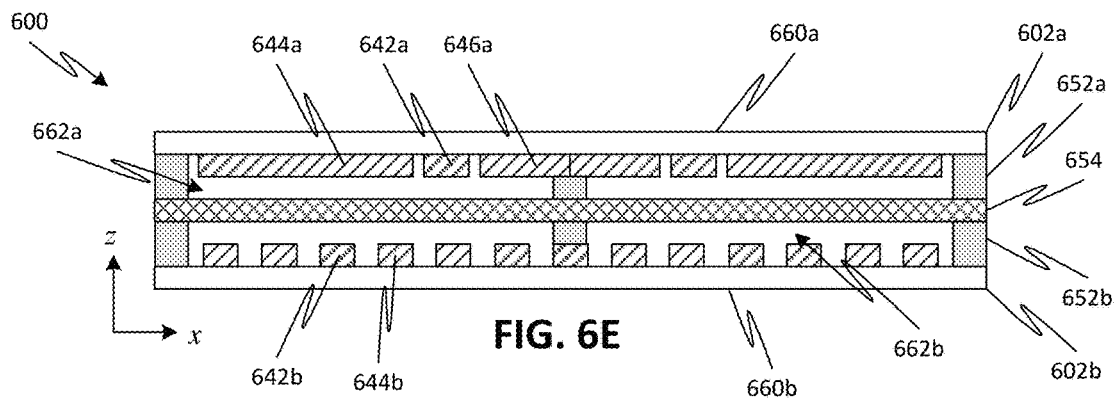
FIG. 6E is a simplified cross-sectional view of a portion of the laminated sensing layers forming the CoP sensor of FIG. 6C.
Figure 6F:
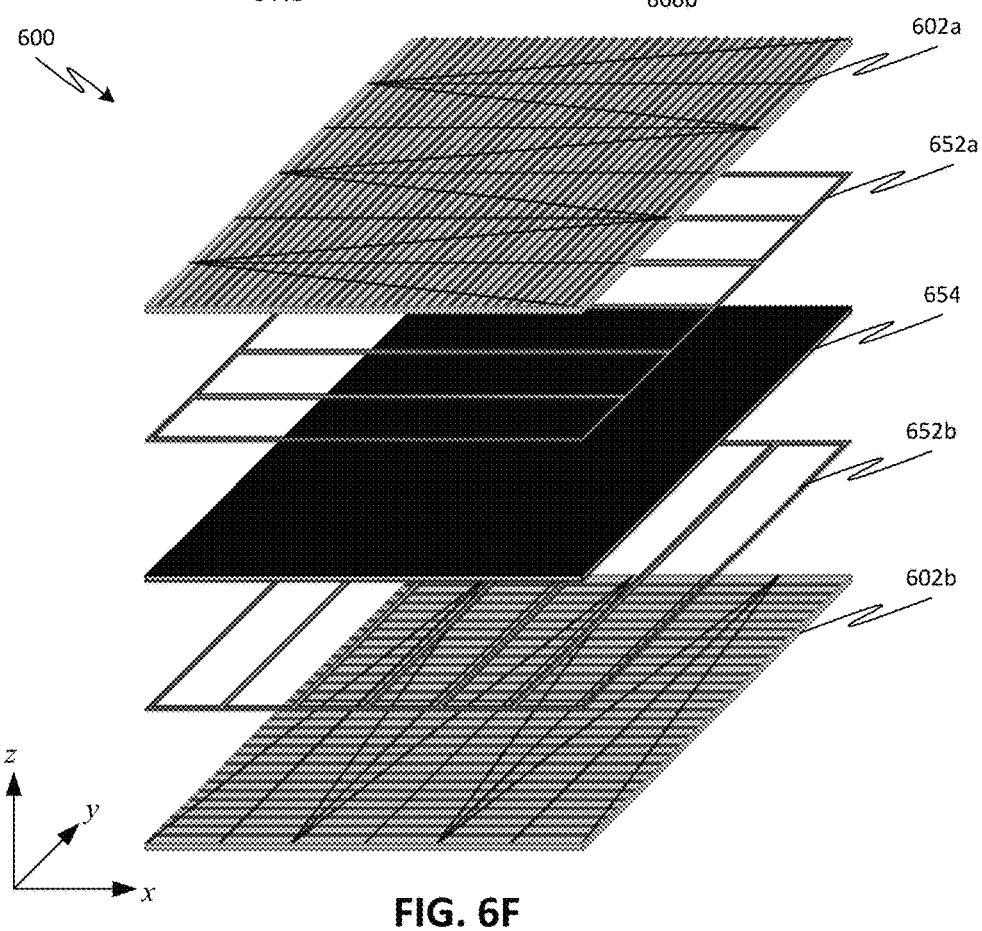
FIG. 6F is an exploded perspective view of the laminated sensing layers forming the CoP sensor of FIG. 6C.
Figure 6G:
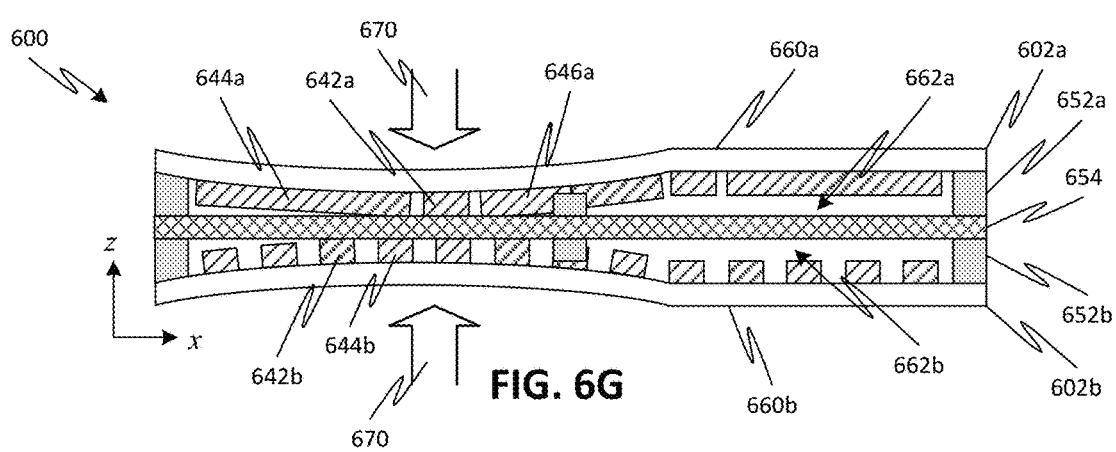
FIG. 6G is a simplified cross-sectional view showing the portion of the laminated sensing layers of FIG. 6E during application of pressure, according to one or more embodiments of the disclosed subject matter.

The operation of the multi-layer sensor 600 will now be described with reference to FIGS. 6E-6G. As noted above, the first sensing layer 602a and the second sensing layer 602b include a plurality of interdigitated electrodes 642a,b, 644a,b, 646a,b patterned according to respective linearly varying sensing apertures (e.g., 608, 610). The electrodes can be formed on a respective flexible insulating substrate 660a, 660b (e.g., a dielectric thin film, such as a polyimide film having a thickness, for example, less than 1 mm). The insulating substrates 660a, 660b can be disposed such that the electrodes formed therein face an interior of sensor 600. A pair of spacer layers 652a, 652b can support the substrates 660a, 660b in a spaced relationship from a conductive layer 654, such that an air gap 662a, 662b is formed between the electrodes and the conductive layer 654. For example, the spacer layers 652a, 652b can be an adhesive polymer, such as an acrylic film, and conductive layer 654 can be a conductive polymer film, such as a polymeric foil (e.g., polyolefin) impregnated with carbon black.

Due to the air gaps 662a, 662b defined by the adhesive spacers 652a, 652b in the sensor 600, the resistance of the electrodes 644a,b 646a,b and the conductive layer 654 remains infinite absent the application of sufficient pressure. When sufficient force/pressure 670 is applied to the sensor 600, as illustrated in FIG. 6G, the electrodes come into contact with the conductive layer 654, such that current is allowed to flow between the power electrodes 642a,b and the sensing electrodes 644a,b, 646a,b. The sensor 600 can respond to bending force (i.e., moment about the x- or y-direction) as well as to distributed pressure in the thickness direction (z-direction), since the sensing characteristic is based on any contact mode between the electrodes of the sensing layers 602a, 602b and the conductive layer 654. Although not shown in the figures, spacer layers 652a, 652b may include one or more openings/ports in their sidewalls to accommodate ingress/egress of air during displacement of the substrates 660a, 660b with respect to the conductive layer 654.

The fundamental sensing mechanism of sensor 600 is similar to that of conventional FSR sensors, where the resistance/conductance of the sensor is dependent upon the applied force. For example, the resistance of the sensor 600 may dramatically decrease when a minimal force is applied, but the conductance may gradually increase with increasing applied pressure. Spatial variations in the electrical properties of the conductive layer 654 may cause undesirable variations in the resistance/conductance response across the sensor. Thus, it is preferable that the conductive layer 654 is substantially homogeneous in three-dimensions, at least with respect to electrical properties such as resistance and conductance.

Figure 7A:
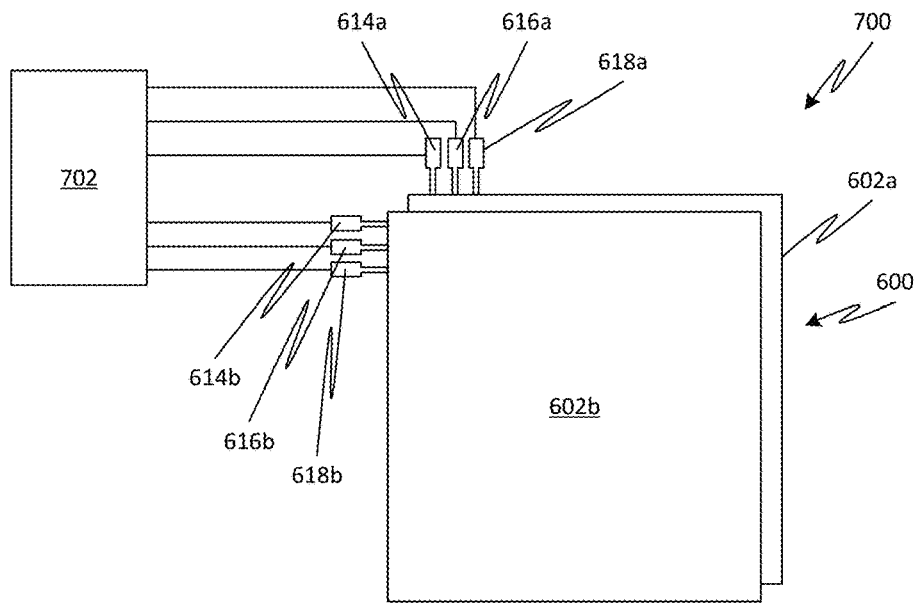
FIG. 7A is a simplified schematic diagram of a generalized sensing system employing a CoP sensor, according to one or more embodiments of the disclosed subject matter.

Referring to FIG. 7A, a generalized CoP sensor system 700 is shown, where the sensing layers 602*a*, 602*b* of a multi-layer sensor 600 are operatively connected to a control unit 702 via the respective terminals, 614*a,b*, 616*a,b*, and 618*a,b*. For example, the control unit 702 can be configured to apply a power (e.g., a DC voltage) to the sensor 600 and to process the resulting output signals from each sensing layer 602*a*, 602*b* to determine a location of a CoP in two-dimensions and/or a magnitude of pressure applied to the sensor 600 in real-time (or substantially in real-time).

In particular, a first output signal ($S_1$) received via terminal 616*a* may be from a first linearly varying sensing aperture of each unit sensing area of the first sensing layer 602*a*, and a second output signal ($S_2$) received via terminal 618*a* may be from a second linearly varying sensing aperture of each unit sensing area of the first sensing layer 602*a*. A third output signal ($S_3$) received via terminal 616*b* may be from a third linearly varying sensing aperture of each unit sensing area of the second sensing layer 602*b*, and a fourth output signal ($S_4$) received via terminal 618*b* may be from a fourth linearly varying sensing aperture of each unit sensing area of the second sensing layer 602*b*.

The control unit 702 may thus determine a location of CoP along a first dimension based on a ratio of the first output signal to a sum of the first and second output signals, i.e., $S_1/(S_1+S_2)$, and a location of CoP along a second dimension based on a ratio of the third output signal to a sum of the third and fourth output signals, i.e., $S_3/(S_3+S_4)$. The control unit 702 can further determine a magnitude of the applied pressure based on a sum of the output signals, for example, $S_1+S_2$, $S_3+S_4$, or $S_1+S_2+S_3+S_4$.

Since the CoP sensor 600 functions as a combination of four variable resistors (i.e., the first 608 and second 610 sensing apertures of the unit sensing areas 604 of the first sensing layer 602*a*, and the first 608 and second 610 sensing apertures of the unit sensing areas 606 of the second sensing layer 602*b*), the output signals from the sensor 600 can be simply processed by the control unit 702, for example, by employing voltage divider circuits.

Figure 7B:
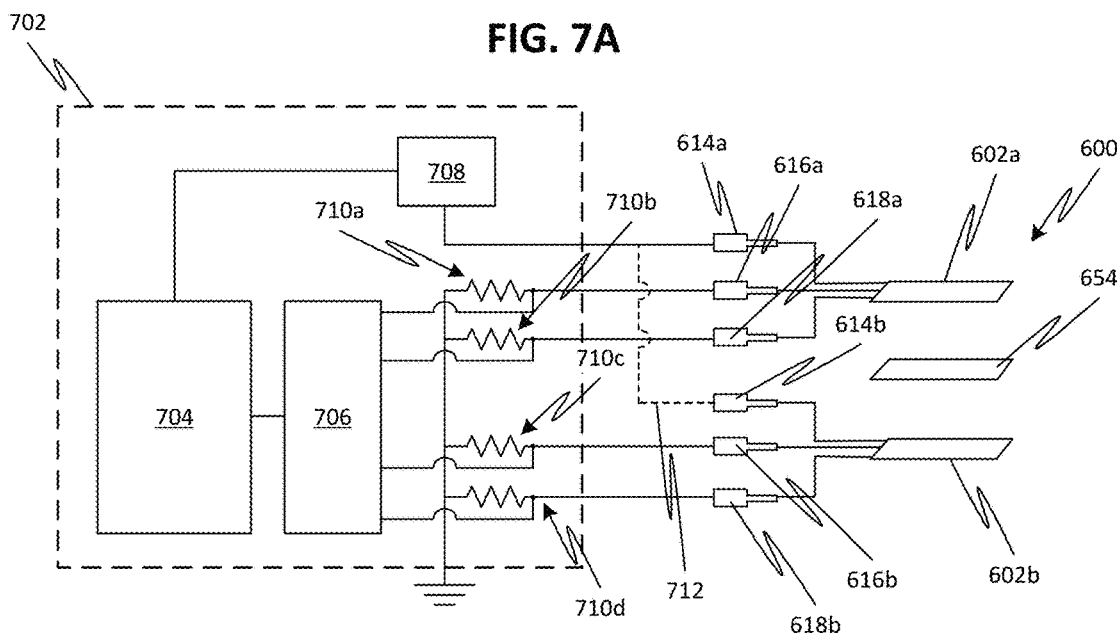
FIG. 7B is a simplified schematic diagram illustrating a first configuration of a sensing system and CoP sensor, according to one or more embodiments of the disclosed subject matter.

For example, FIG. 7B illustrates a sensor system setup for processing signals from the sensor 600 to determine CoP. The control unit 702 can include, for example, a processor 704, a data acquisition unit 706 (e.g., an analog-to-digital converter), and a power source 708. The control unit 702 can also include a plurality of resistor elements 710*a*-710*d*, with each resistor element corresponding to one of the output terminals 616*a,b* and 618*a,b*. The processor 704 can be operatively connected to the data acquisition unit 706 to receive signals from the sensor 600 and can be operatively connected to the power supply 708 to control the application of power (e.g., a DC voltage, for example, 5 $V_{DC}$) to the sensor 600. Note that, in some embodiments, one or more of the components identified as part of the control unit 702 may be provided separately from the other components. For example, the power source 708 may be provided as a separate, independently-controlled unit from the processor 704 and data acquisition unit 706.

The control unit 702 is electrically connected to at least five terminals of the sensor 600 to detect the CoP location and pressure magnitude within the sensing areas of the sensor 600. The input power from power source 708 can be supplied to the power supply terminal 614*a* of the first sensing layer 602*a*, while the power supply terminal 614*b* of the second sensing layer 602*b* remains isolated/floating. Alternatively, the input power can be supplied to both power supply terminals 614*a*, 614*b*, as indicated by dotted line 712 in FIG. 7B. The control unit can be electrically connected to the output terminals 616*a,b*, 618*a,b* via a voltage divider network formed by corresponding resistors 710*a*-710*d*. Thus, only five electric wires—one for power input and four for output voltage signals—can be used to measure the pressure information for sensor 600.

Figure 7C:
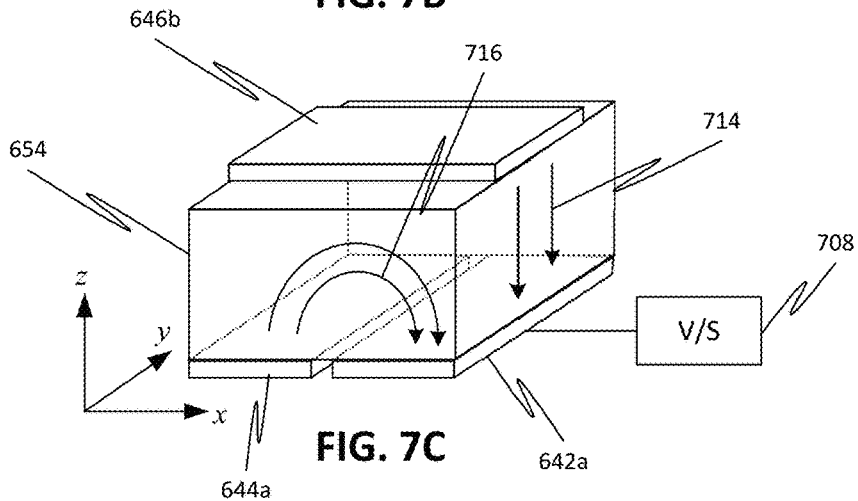
FIG. 7C is a simplified illustration of the pressure sensing mechanism underlying the configuration of FIG. 7B.

FIG. 7C shows a simplified cross-sectional view of a portion of sensor 600 to explain operation thereof during pressure application. In particular, the applied pressure is of sufficient magnitude that electrodes of the illustrated portions of the first and second sensing layers have displaced through their respective air gaps into contact with the conductive layer 654. Thus, electrode 646*b* (and/or 644*b*) is in contact with a first surface of the conductive layer 654 while electrodes 642*a* and 644*a* (and/or 646*a*) are in contact with an opposite, second surface of the conductive layer 654. The contact with the conductive layer 654 puts the electrodes 642*a*, 644*a* (and/or 646*a*), and 646*b* (and/or 644*b*) into electrical connection with each other.

Power from the power supply 708 is applied to power electrode 642*a* via the power supply terminal 614*a*. Due to the electrical connection between the electrodes via the conductive layer 654, electrons 714 flow in the thickness direction of the conductive layer 654 to the power electrode 642*a*. Simultaneously, electrons 716 of the other first sensing layer electrode 644*a* flow in an in-plane direction to the power electrode 642*a* via the conductive layer 654.

By using a voltage divider configuration formed by resistors 710*a*-710*d*, the control unit 702 measures the voltage variation due to the surface and in-plane resistance changes on the conductive layer 654 deformed by the applied pressure via the signals from terminals 616*a*, 618*a* of the first sensing layer 602*a*, and measures the voltage variation due to the through-thickness resistance changes on the same conductive layer 654 under the deformed state via the signals from terminals 616*b*, 618*b* of the second sensing layer 602*b*. For example, the output voltage corresponding to each output terminal 616*a,b*, and 618*a,b*, can be given by:

$$V_{out,i} = V_{in}\left(\frac{R_i}{R + R_i}\right) \text{ for } i = 1, 2, 3, 4 \qquad (5)$$

where $V_{in}$ is the voltage input to the power terminal 614*a*, R is the resistance of the respective reference resistor 710*a*-710*d* (e.g., 100 kΩ for high sensitivity), and $R_i$ is the respective resistance value of the i-th sensing group corresponding to output terminal 616*a,b* or 618*a,b*.

The contact resistance is dependent on the surface properties of the interdigitated electrodes of the first and second sensing layers 602*a*, 602*b* and the conductive layer 654; the geometrical pattern of the interdigitated electrodes (i.e., due to the respective sensing apertures 608, 610); and the applied pressure. Once the electrode geometry and surface properties are static (i.e., after the interdigitated electrodes contact the conductive layer 654 for a given pressure application), the contact resistance is then only influenced by the applied pressure, and thus a change in the contact resistance can provide a measure of a magnitude of the applied pressure.

A multi-layer sensor 600 was fabricated according to the configuration of FIG. 6C and the processing setup of FIG. 7B was used to detect pressure applied to the sensor 600. To test performance of the sensor 600, two permanent magnet cubes with a dimension of ⅜×⅜×⅜ inches were used to apply a locally distributed pressure to a selected position within the CoP sensing sections (i.e., magnets applied on opposite sides of the sensor 600 and collocated such that their attractive force applies a constant compression force to the sensor over a fixed area). Custom adapters were utilized to attach the magnets to the CoP sensor, and its contact surface area was 0.45×0.45 inches, which was slightly bigger than the physical pressure sensing area of each unit sensing cell 612 of the sensor 600 (e.g., 0.41×0.41 inches).

The four measurement signals resulting from the force applied to a particular sensing cell 612 were then used to determine the CoP location in the Cartesian coordinate plane. All the sensing sections of the 2-D CoP sensor 600 were investigated to detect the centroid location and total magnitude of the distributed pressure by the individually collocated magnets. Mean and standard deviation values were determined using six sets of the measurement data.

Figure 9A:
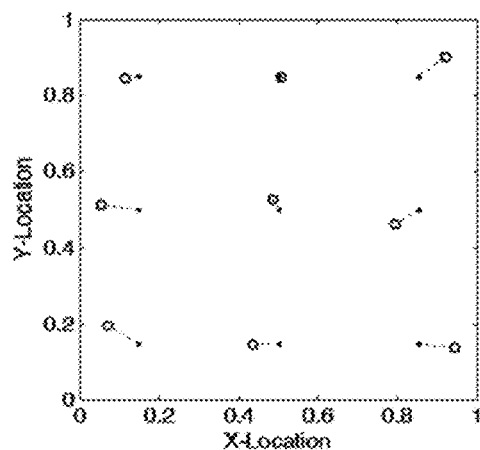
FIG. 9A is a two-dimensional map of measured versus actual CoP using a CoP sensor fabricated with three patterned sensing areas on each sensing layer, according to one or more embodiments of the disclosed subject matter.
Figure 9B:
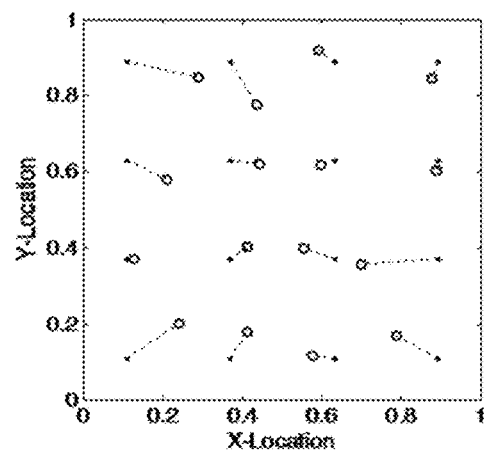
FIG. 9B is a two-dimensional map of measured versus actual CoP using a CoP sensor fabricated with four patterned sensing areas on each sensing layer, according to one or more embodiments of the disclosed subject matter.
Figure 9C:
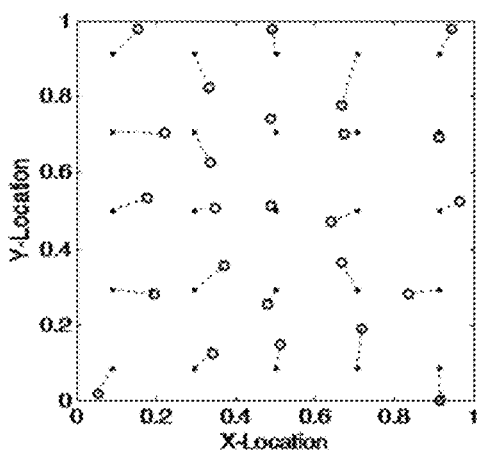
FIG. 9C is a two-dimensional map of measured versus actual CoP using a CoP sensor fabricated with five patterned sensing areas on each sensing layer, according to one or more embodiments of the disclosed subject matter.
Figure 9D:
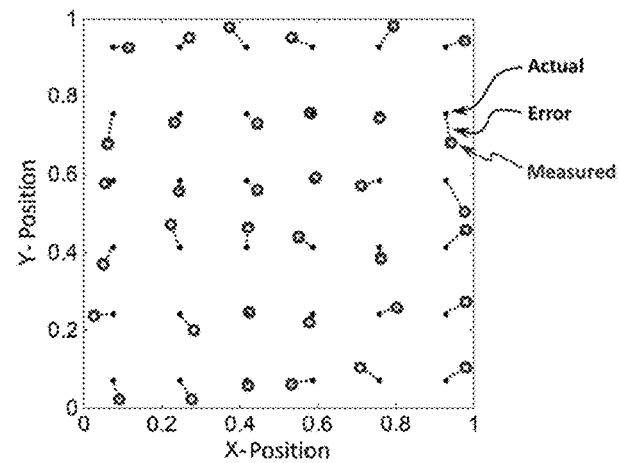
FIG. 9D is a two-dimensional map of measured versus actual CoP using a CoP sensor fabricated with six patterned sensing areas on each sensing layer, according to one or more embodiments of the disclosed subject matter.

The CoP location results are shown in the two-dimensional map of FIG. 9D, where open circles represent the measured data and filled circles represent the actual CoP based on the location of the magnets. The CoP locational error (dotted lines) was determined by the straight distance between the actual and measured data, and the averaged locational error was less than 5%. In general, the locational error increases as the collocated magnets are placed close to the four edges of the CoP sensor 600. Since the size of the linearly variable apertures 608, 610 near the edges is very small relative to that of the uniform aperture (i.e., the combination of 608 and 610), the interdigitated electrode pattern associated with the linear aperture shading has short-length electrodes that may be less sensitive to the pressure applied by the magnets. Decreasing the total number of the pressure sensing sections in the 2-D sensor or increasing the total amount of the interdigitated electrode lines may reduce the locational error close to the edges of the CoP sensor. For example, the total number of the electrode lines can be increased if the width of and the gap between the electrode lines are reduced. Alternatively or additionally, a compensation weighting function (e.g., based on curve fitting of the measured data) can be applied to the detected signals (e.g., via processor 704) to increase the accuracy of the sensor 600 close to its edges.

Figure 9E:
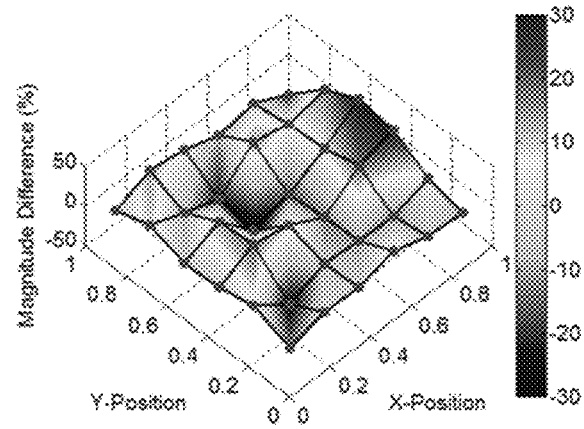
FIG. 9E is a two-dimensional map of measured pressure magnitude versus actual pressure magnitude using a CoP sensor fabricated with six patterned sensing areas on each sensing layer, according to one or more embodiments of the disclosed subject matter.

FIG. 9E shows a map of variances in the total pressure magnitude measured for each unit cell 612 of the pressure sensor 600. Although the same set of magnets is used for each unit cell 612, the resultant pressure magnitude values were noticeably different, with an averaged difference of about 12.4% with respect to the mean measured value. Improvements in the homogeneity of the conductive layer 654 can further enhance the precision between the unit cells 612. However, because the CoP measurement relies on a ratio of signals, spatial variations of the conductive layer 654 has less of an effect, with CoP location results generally deviating less than 5% from actual values.

Similar results can be obtained for different sized sensors. For example, FIG. 9A illustrates the results for a multi-layer sensor having a configuration similar to that of sensor 600 but with a 3×3 array (i.e., three unit sensing areas 604 on the first sensing layer 602a and three unit sensing areas 606 on the second sensing layer 602b) instead of 6×6 array. FIG. 9B illustrates the results for a multi-layer sensor having a configuration similar to that of sensor 600 but with a 4×4 array. FIG. 9C illustrates the results for a multi-layer sensor having a configuration similar to that of sensor 600 but with a 5×5 array.

Figure 10A:
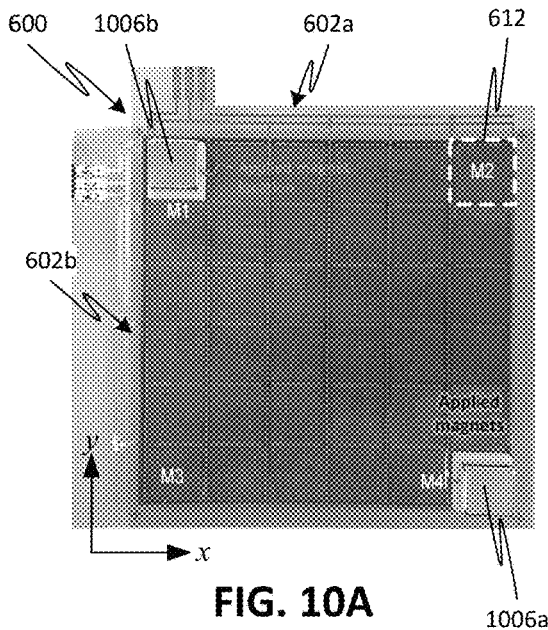
FIG. 10A is a plan view image of an experimental setup for measuring CoP for multiple pressure points simultaneously applied to a CoP sensor fabricated with six patterned sensing areas on each sensing layer, according to one or more embodiments of the disclosed subject matter.
Figure 10B:
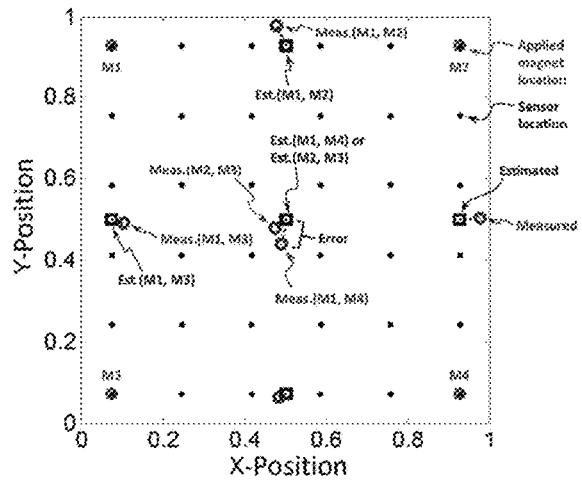
FIG. 10B is a two-dimensional map of measured versus actual CoP in the experimental setup of FIG. 10A.

As shown in FIG. 10A, two sets of the co-located magnets 1006b, 1006a (although only the magnets on the top sensing layer 602a are shown in the figure) were used in two separate unit sensing sections 612 of CoP sensor 600 in order to investigate the CoP detection capability for multiple local pressure distributions. Although there are two local pressure distributions by magnets 1006a (M4), 1006b (M1), the CoP sensor 600 detects the centroid of the integrated form of the two pressure distributions. For example, under the ideal uniform condition of the two local pressure distributions by magnets 1006a,b illustrated in FIG. 10A, the corresponding CoP location should be estimated as (0.5, 0.5), which is the center position of the sensor 600. Likewise, the same CoP location will be determined for the two local pressure distributions by magnets arranged at opposite corners (M2, M3) from M1 and M4. FIG. 10B illustrates the determined CoP results for magnets applied at various location pairs M1-M4, where squares represent the estimated CoP based on the magnet locations, and circles represent the experimentally-determined CoP locations. The locational error is identified with the dotted lines in the figure.

Although a specific configuration for the sensor 600 and a corresponding sensor system has been illustrated in FIGS. 6A-7C and performance thereof has been discussed with respect to FIGS. 9A-10B above, embodiments of the disclosed subject matter are not limited to that specific configuration. Indeed, other configurations are also possible according to one or more contemplated embodiments. For example, rather than applying power to a particular electrode in one of the first and sensing layers, power may be applied to the intervening conductive layer to achieve a similar effect as the sensor 600.

For example, FIG. 8A illustrates an exemplary sensor system setup where power is applied to the conductive layer 854 rather than one of the sensing layers 802a,b of a CoP sensor 800. The system remains capable of detecting CoP using no more than four output signals—two output signals from each sensing layer 802a,b via respective output terminals 816a,b, 818a,b—and a single power input. Since power is applied via the conductive layer 854, the power electrode 632 in each sensing layer 802a, 802b can be omitted from the interdigitated electrode pattern. Thus, each unit cell 812 has a first array of interdigitated electrodes 844 connected together by trace 834 and a separate second array of interdigitated electrodes 846 connected together by trace 836, as illustrated in FIG. 8B. It is also possible to move the first and second arrays closer together, for example by offsetting one with respect to the other in the y-direction, such that electrodes 844 extend into the gaps between electrodes 846, and vice versa, as illustrated by the unit cell 812a of FIG. 8C.

FIG. 8D shows a simplified cross-sectional view of a portion of sensor 800 to explain operation of the sensing setup of FIG. 8A during pressure application. In particular, the applied pressure is of sufficient magnitude that electrodes of the illustrated portions of the first and second sensing layers 802a,b have displaced through their respective air gaps into contact with the conductive layer 854.

Thus, electrode 846*b* (or 844*b*) is in contact with a first surface of the conductive layer 854 while electrode 846*a* (or 844*a*) is in contact with an opposite, second surface of the conductive layer 854. The contact with the conductive layer 854 puts each of the electrodes 846*a,b* (and/or 844*a,b*) into electrical connection with each other. Due to the electrical connection between the electrodes 846*a,b* and the conductive layer 854, electrons flow from the electrodes 846*a,b* through the conductive layer 854 to the power supply 708. The operation of the sensing system of FIG. 8A is otherwise similar to that of FIG. 7B, and details regarding such can be found in the corresponding description provided above.

Figure 11B:
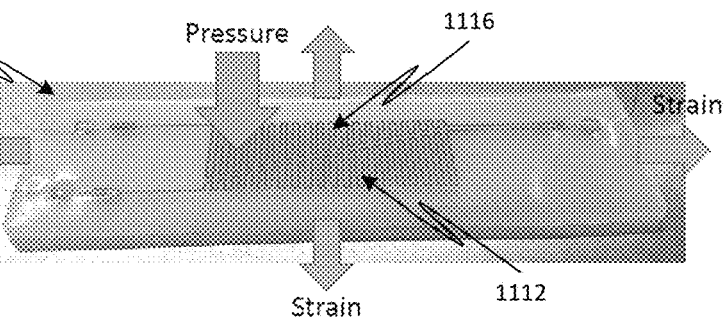
FIGS. 11A-11B are plan and perspective view images, respectively, of an exemplary configuration of a sensing area for a CoP sensor employing a piezo-resistive material, according to one or more embodiments of the disclosed subject matter.
Figure 11A:
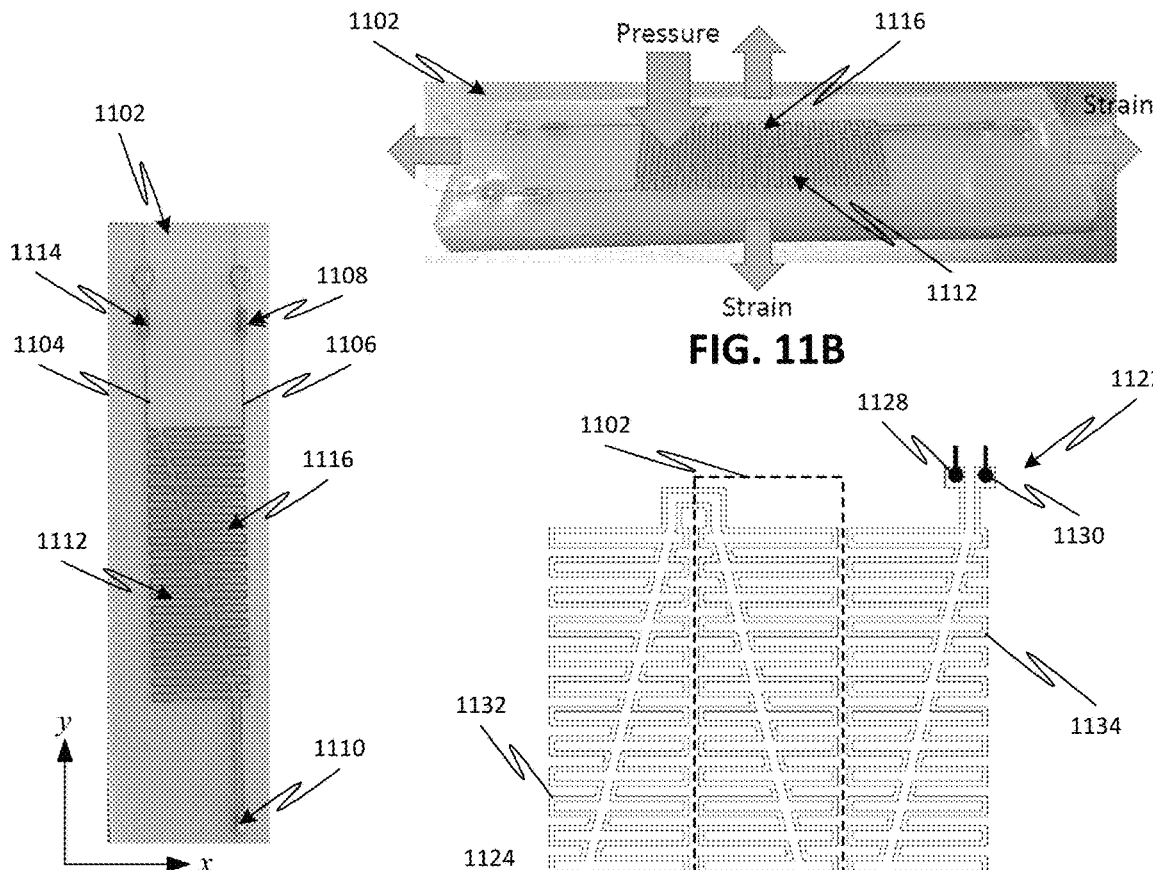
Figure 11C:
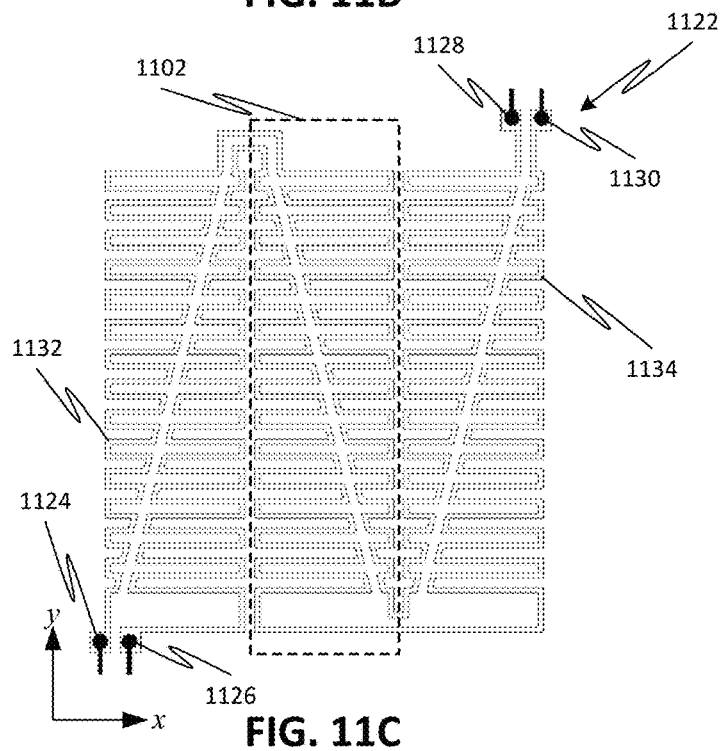
FIG. 11C is a simplified plan view of an arrangement for an array of the patterned sensing area of FIG. 11A for a sensing layer of the CoP sensor, according to one or more embodiments of the disclosed subject matter.
Figure 12A:
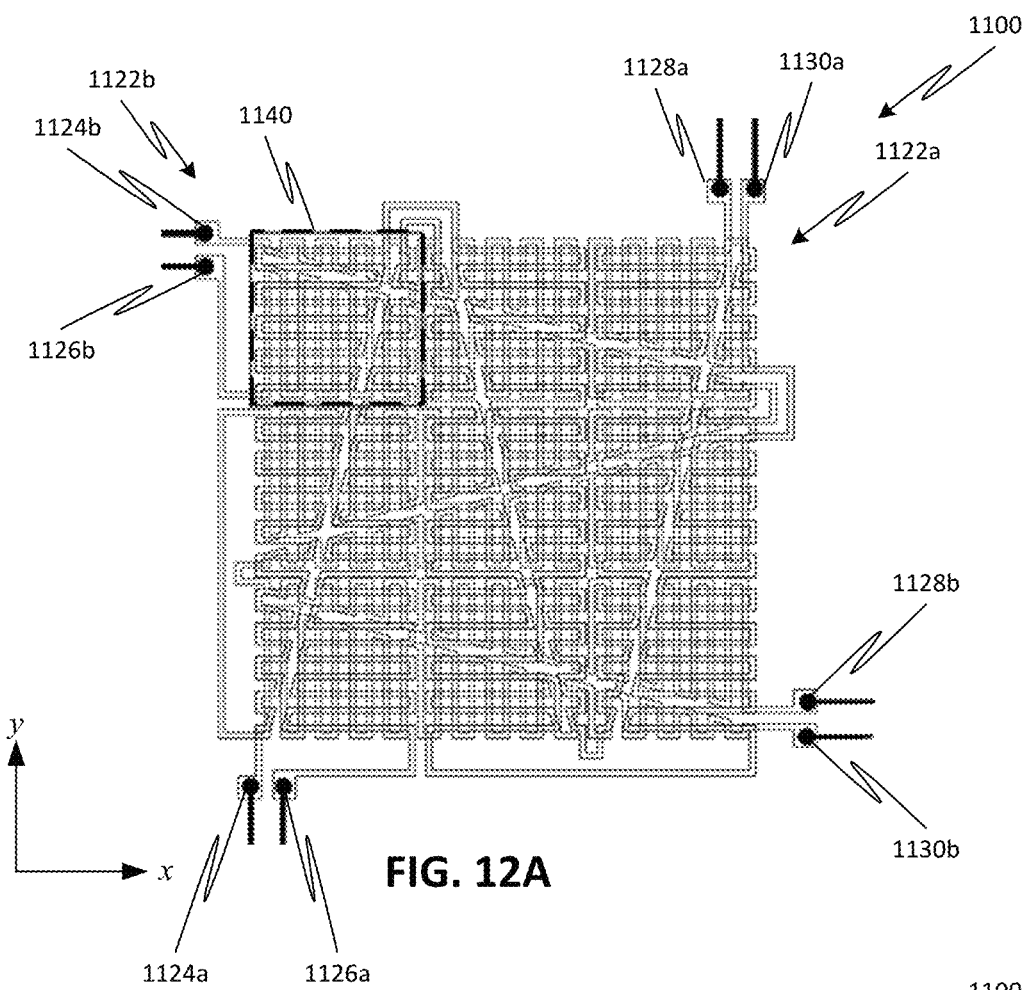
FIG. 12A is a plan view of an exemplary configuration of the sensing layers of FIG. 11C laminated to form a CoP sensor employing the piezo-resistive material, according to one or more embodiments of the disclosed subject matter.
Figure 12B:
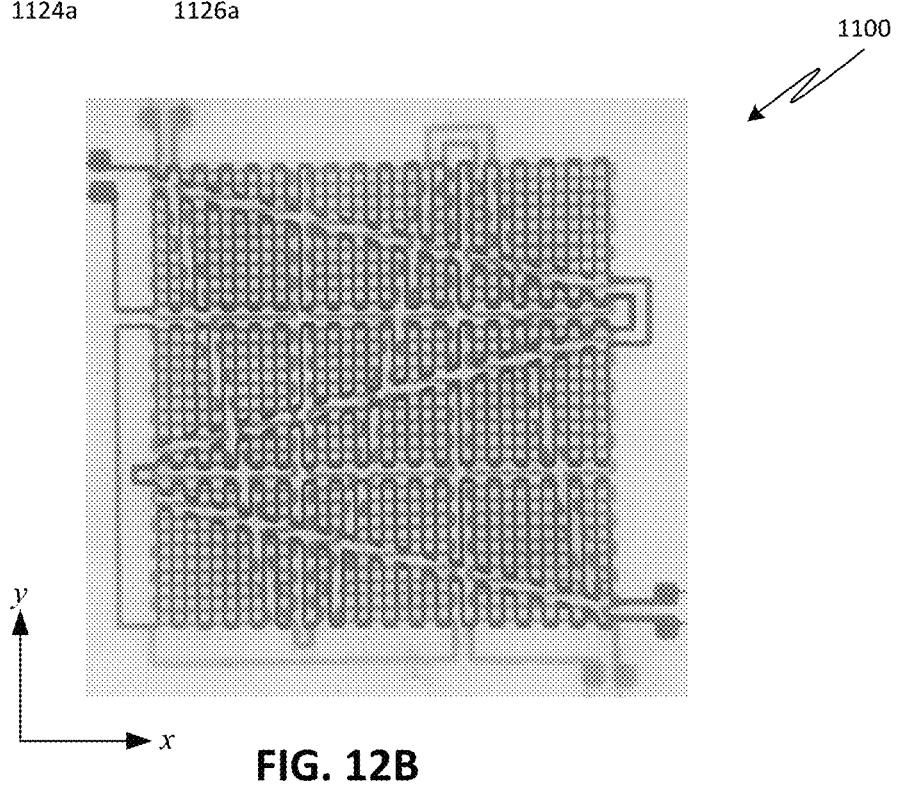
FIG. 12B is a plan view image of a fabricated CoP sensor according to the configuration of FIG. 12A.

In another contemplated configuration, the multi-layer sensor can employ a piezo-resistive material as the sensing element and patterned by linearly varying sensing apertures in accordance with the above described teachings. For example, the piezo-resistive material can be a liquid metal (e.g., a combination of gallium, indium, and tin). FIGS. 11A-11B illustrate a unit sensing area configuration for such a sensor, while FIG. 11C illustrates a sensing area of a first sensing layer for such a sensor. FIGS. 12A-12B illustrate plan views of the assembled sensing layers for such a sensor.

Referring to FIG. 11A, the unit sensing area 1102 includes a pair of meandering first 1104 and second 1106 channels formed in a flexible substrate (e.g., flexible polymer, such as, but not limited to, polydimethylsiloxane (PDMS)), where the meandering nature of each channel is defined by respective linearly varying aperture patterns 1112, 1116. Each channel 1104, 1106 can be filled with the liquid metal, and electrical connection to the liquid metal can be made at respective ends of the channels. For example, power (e.g., DC voltage) can be applied to a power terminal 1110 at a common end of the channels 1104, 1106, while a resulting output signal (i.e., based on a change in resistance of the liquid metal in the channels) can be detected at terminal 1114 at the end of channel 1104 and terminal 1108 at the end of channel 1106.

As with previously described embodiments of the CoP sensor, the unit sensing cell 1102 employing liquid metal can measure CoP based on voltage signals that reflect changes in resistances within the linearly varying aperture patterns 1112, 1116. In particular, the resistance of the liquid metal can change according to the applied pressure (i.e., applied perpendicular to the plane of the sensing layer). A ratio of the signal output from one of the linearly varying apertures 1112, 1116 to a sum of the signals output from both of the linearly varying apertures 1112, 1116 can thus be used to determine a location of the CoP. The sum of the signals from the linearly varying apertures 1112, 1116 can also be used to determine a magnitude of the applied pressure. The resistance of the liquid metal may also change based on strain applied to the sensor (i.e., applied within the plane of the sensing layer). Thus, the unit sensing cell 1102 can provide simultaneous measurements of both pressure and strain.

As with previously described embodiments of the CoP sensor, the sensor employing liquid metal can be formed by arraying the unit sensing cell 1102 across the sensing area of each sensing layer, for example, as illustrated in FIG. 11C. The sensing areas of the same sensing apertures among the unit cells 1102 may be connected together in series, such that a continuous channel 1132 is formed for the sensing areas with the first linearly varying aperture 1112 and a second continuous channel 1134 is formed for the sensing areas with the second linearly varying aperture 1116. Thus, multiple unit sensing cells 1102 across a sensing layer 1122 can be interrogated using a common input and output. For example, power can be applied to channel 1132 via power terminal 1124 while an output signal is obtained from an opposite end of channel 1132 via output terminal 1128. Similarly, power can be applied to channel 1134 via power terminal 1126 while an output signal is obtained from an opposite end of channel 1134 via output terminal 1130. Thus, each sensing layer 1122 can yield a pair of output signals that can be used to determine CoP.

As with previously described embodiments of the CoP sensor, the sensor 1100 employing liquid metal can be formed by laminating a first sensing layer 1122*a* with a second sensing layer 1122*b*, for example, as illustrated in FIG. 12A. The second sensing layer 1122*b* can be identical to that of first sensing layer 1122*a*, but rotated 90° about the z-direction. Thus, each sensing layer 1122*a,b* has respective power terminals 1124*a,b* and 1126*a,b* and respective output terminals 1128*a,b* and 1130*a,b*. The overlap of the unit sensing area 1102 of the first sensing layer 1122*a* and the second sensing layer 1122*b* can delineate a square array of respective unit sensing cells 1140 (only one of which is identified in FIG. 12A).

Although power terminals 1124, 1126 are shown as separate in FIGS. 11C-12A, it is also possible that the power terminals within each sensing layer 1122*a,b* can be combined, such that each sensing layer 1122*a,b* requires a single power input and a pair of outputs. Similarly, the power terminals between sensing layers 1122*a,b* may also be combined, such operation of the full multi-layer sensor 1100 can be achieved using a single power input and no more than four signal outputs.

In the above described embodiments, the illustration and description have focused on a planar arrangement of the multi-layer sensor. While the multi-layer sensor may have an initially planar (i.e., flat) configuration, it is contemplated that the sensor is formed from sufficiently flexible materials that it can conform to the non-flat shape of a desired measurement surface. For example, the multi-layer sensor may be attached to a curved surface to measure the pressure applied to the curved surface. If any changes occur in signal outputs due to the change in shape of the sensor to accommodate the non-flat surface shape, the control unit 702 may be configured to account for such changes, for example, by calibration using an appropriate weighting function.

Embodiments of the disclosed subject matter can be used in a wide range of applications to detect the location of CoP and/or pressure magnitude. Such applications include, but are not limited to, detecting force application in athletics, such as lining a football player's helmet to monitor for concussions; projectile impact detection, such as lining a piece of armor or body armor to detect impact of a bullet therewith; structural damage detection, such as disposed on a surface of or within a structure (e.g., building, bridge, vehicle, plane, etc.) to detect impact or application of a damaging force (e.g., wind); and touch location detection, such as a touch sensitive surface to be used as a keyboard. Other applications of the disclosed multi-layer CoP sensors will be readily apparent to one of ordinary skill in the art.

It will be appreciated that the aspects of the disclosed subject matter can be implemented, fully or partially, in hardware, hardware programmed by software, software instruction stored on a computer readable medium (e.g., a non-transitory computer readable medium), or any combination of the above.

For example, components of the disclosed subject matter, including components such as a controller, process, or any other feature, can include, but are not limited to, a personal computer or workstation or other such computing system that includes a processor, microprocessor, microcontroller device, or is comprised of control logic including integrated circuits such as, for example, an application specific integrated circuit (ASIC).

Features discussed herein can be performed on a single or distributed processor (single and/or multi-core), by components distributed across multiple computers or systems, or by components co-located in a single processor or system. For example, aspects of the disclosed subject matter can be implemented via a programmed general purpose computer, an integrated circuit device, (e.g., ASIC), a digital signal processor (DSP), an electronic device programmed with microcode (e.g., a microprocessor or microcontroller), a hard-wired electronic or logic circuit, a programmable logic circuit (e.g., programmable logic device (PLD), programmable logic array (PLA), field-programmable gate array (FPGA), programmable array logic (PAL)), software stored on a computer-readable medium or signal, an optical computing device, a networked system of electronic and/or optical devices, a special purpose computing device, a semiconductor chip, a software module or object stored on a computer-readable medium or signal.

When implemented in software, functions may be stored on or transmitted over as one or more instructions or code on a computer-readable medium. The steps of a method or algorithm disclosed herein may be embodied in a processor-executable software module, which may reside on a computer-readable medium. Instructions can be compiled from source code instructions provided in accordance with a programming language. The sequence of programmed instructions and data associated therewith can be stored in a computer-readable medium (e.g., a non-transitory computer readable medium), such as a computer memory or storage device, which can be any suitable memory apparatus, such as, but not limited to read-only memory (ROM), programmable read-only memory (PROM), electrically erasable programmable read-only memory (EEPROM), random-access memory (RAM), flash memory, disk drive, etc.

As used herein, computer-readable media includes both computer storage media and communication media, including any medium that facilitates the transfer of a computer program from one place to another. Thus, a storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a transmission medium (e.g., coaxial cable, fiber optic cable, twisted pair, digital subscriber line (DSL), or wireless technologies such as infrared, radio, and microwave), then the transmission medium is included in the definition of computer-readable medium. Moreover, the operations of a method or algorithm may reside as one of (or any combination of) or a set of codes and/or instructions on a machine-readable medium and/or computer-readable medium, which may be incorporated into a computer program product.

One of ordinary skill in the art will readily appreciate that the above description is not exhaustive, and that aspects of the disclosed subject matter may be implemented other than as specifically disclosed above. Indeed, embodiments of the disclosed subject matter can be implemented in hardware and/or software using any known or later developed systems, structures, devices, and/or software by those of ordinary skill in the applicable art from the functional description provided herein.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

The terms "system," "device," and "module" have been used interchangeably herein, and the use of one term in the description of an embodiment does not preclude the application of the other terms to that embodiment or any other embodiment.

The foregoing descriptions apply, in some cases, to examples generated in a laboratory, but these examples can be extended to production techniques. Thus, where quantities and techniques apply to the laboratory examples, they should not be understood as limiting.

It is thus apparent that there is provided, in accordance with the present disclosure, two-dimensional center of pressure sensing systems, devices, and methods. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternative, modifications, equivalents, and variations that are within the spirit and scope of the present invention.

The invention claimed is:

1. A sensor system comprising:
a sensor comprising a first layer and a second layer,
the first layer having a first sensing area patterned by a set of first sensing apertures, each first sensing aperture having a respective linear variation along a first direction, a combination of the set of first sensing apertures forming a uniform sensing aperture;
the second layer having a second sensing area overlaying the first sensing area, the second sensing area being patterned by a set of second sensing apertures, each second sensing aperture having a respective linear variation along a second direction orthogonal to the first direction, a combination of the set of second sensing apertures forming another uniform sensing aperture; and
a control unit coupled to the first and second layers and configured to determine a location in two-dimensions of a center of pressure applied to the first and second layers based on respective signals from the first and second sensing areas,
wherein the control unit determines the location of the center of pressure along the first direction and along the second direction based on a first ratio and a second ratio, respectively, the first ratio being a ratio of a signal from one of the first sensing aperture patterns to a combination of signals from the set of first sensing aperture patterns, and the second ratio being a ratio of a signal from one of the second sensing aperture patterns to a combination of signals from the second sensing aperture patterns.

2. The sensor system of claim 1, wherein:

the set of first sensing apertures comprises a first pair of complementary sensing apertures, the linear variation along the first direction of one of the first pair being opposite to that of the other of the first pair, and the set of second sensing apertures comprises a second pair of complementary sensing apertures, the linear variation along the second direction of one of the second pair being opposite to that of the other of the second pair.

3. The sensor system of claim 1, wherein at least one of the set of first sensing apertures and the set of second sensing apertures comprises more than two sensing apertures.

4. The sensor system of claim 1, wherein, in plan view, the second sensing area has a layout that is substantially identical to the first sensing area rotated 90°.

5. The sensor system of claim 1, wherein:

the first layer has a plurality of the first sensing areas disposed adjacent along the second direction, the second layer has a plurality of the second sensing areas disposed adjacent along the first direction, and a number of the first sensing areas in the first layer is the same as a number of the second sensing areas in the second layer.

6. The sensor system of claim 5, wherein, in plan view, a total area of the first sensing areas in the first layer is coincident with a total area of the second sensing areas in the second layer.

7. The sensor system of claim 5, wherein the first sensing areas are connected together in parallel, and the second sensing areas are connected together in parallel.

8. The sensor system of claim 1, wherein the sensor comprises at least one of a piezo-resistive material, a piezo-electric material, and a piezo-conductive material.

9. The sensor system of claim 1, wherein the sensor employs a force sensitive resistance (FSR) technique, where each of the first and second sensing areas includes interdigitated electrodes on an insulating substrate.

10. The sensor system of claim 9, wherein lengths along the second direction of the interdigitated electrodes in the first sensing area vary based on the first sensing apertures, and lengths along the first direction of the interdigitated electrodes in the second sensing area vary based on the second sensing apertures.

11. The sensor system of claim 9, wherein the sensor comprises:

a conductive layer disposed between the first and second layers;

a first spacer layer defining a first air gap between the first layer and the conductive layer; and a second spacer layer defining a second air gap between the second layer and the conductive layer, wherein the sensor is constructed such that pressure applied to the first and second layers causes at least one of the interdigitated electrodes to displace into electrically-conductive contact with the conductive layer.

12. The sensor system of claim 1, wherein at least one of the first and second sensing areas is formed by a liquid metal embedded in a flexible substrate.

13. The sensor system of claim 12, wherein the liquid metal comprises a combination of gallium (Ga), indium (In), and tin (Sn).

14. The sensor system of claim 12, wherein the first and second layers are further constructed to measure strain applied in a plane parallel to the first and second layers.

15. The sensor system of claim 1, wherein the control unit is further configured to determine a magnitude of the pressure applied to the first and second layers.

16. The sensor system of claim 1, wherein the control unit is configured to determine the location of the center of pressure in two-dimensions based on no more than four output signals from the first and second layers.

17. The sensor system of claim 16, wherein:

the first layer has a plurality of the first sensing areas disposed adjacent to each other along the second direction, the second layer has a plurality of the second sensing areas disposed adjacent to each other along the first direction, a number of the first sensing areas in the first layer is the same as a number of the second sensing areas in the second layer, and the number of the first and second sensing areas is at least two.

18. A method of determining a location of a center in two-dimensions of applied pressure, the method comprising:

providing a multi-layer sensor having a first sensing layer with a first sensing area and a second sensing layer with a second sensing area, the first sensing area including a plurality of first sensing cells disposed along a second direction, the second sensing area including a plurality of second sensing cells disposed along a first direction orthogonal to the second direction, the first and second sensing areas overlapping in plan view;

receiving no more than four output signals from the first and second sensing layers;

determining the location of the center of pressure along the first direction based on a ratio of one of the output signals received from the first sensing layer to a sum of the output signals received from the first sensing layer; and determining the location of the center of pressure along the second direction based on a ratio of one of the output signals received from the second sensing layer to a sum of the output signals received from the second sensing layer.

19. The method of claim 18, wherein:

each of the first and second sensing cells is respectively defined by a set of linearly-varying sensing aperture patterns, and in each of the first and second sensing cells a combination of the respective set of linearly-varying sensing aperture patterns form a uniform sensing aperture pattern.

20. The method of claim 19, wherein each set of linearly-varying sensing aperture patterns comprises a pair of complementary sensing aperture patterns, the linear variation of one of the pair being opposite to that of the other of the pair.

21. The method of claim 19, wherein each set of linearly-varying sensing aperture patterns comprises more than two sensing aperture patterns.

22. The method of claim 18, wherein the multi-layer sensor comprises at least one of a piezo-resistive material, a piezo-electric material, and a piezo-conductive material.

23. A sensor system comprising:

a sensor comprising a first layer and a second layer, the first layer having a first sensing area patterned by a set of first sensing apertures, each first sensing aperture having a respective linear variation along a first direction, a combination of the set of first sensing apertures forming a uniform sensing aperture; and the second layer having a second sensing area overlaying the first sensing area, the second sensing area being patterned by a set of second sensing apertures, each second sensing aperture having a respective linear variation along a second direction orthogonal to the first direction, a combination of the set of second sensing apertures forming another uniform sensing aperture, wherein the sensor employs a force sensitive resistance (FSR) technique, where each of the first and second sensing areas includes interdigitated electrodes on an insulating substrate, and the sensor comprises:

a conductive layer disposed between the first and second layers;

a first spacer layer defining a first air gap between the first layer and the conductive layer; and a second spacer layer defining a second air gap between the second layer and the conductive layer, wherein the sensor is constructed such that pressure applied to the first and second layers causes at least one of the interdigitated electrodes to displace into electrically-conductive contact with the conductive layer.

* * * * *